(12) United States Patent
Hong et al.

(10) Patent No.: US 12,068,365 B2
(45) Date of Patent: Aug. 20, 2024

(54) SEMICONDUCTOR DEVICE INCLUDING GUARD RINGS

(71) Applicant: SAMSUNG ELECTRONICS CO., LTD., Suwon-si (KR)

(72) Inventors: Seulki Hong, Seoul (KR); Hyungjong Lee, Osan-si (KR); Moongi Cho, Seoul (KR); Myungsoo Noh, Suwon-si (KR); Sunghwan Bae, Seoul (KR); Jeonglim Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 626 days.

(21) Appl. No.: 17/039,333

(22) Filed: Sep. 30, 2020

(65) Prior Publication Data

US 2021/0257449 A1 Aug. 19, 2021

(30) Foreign Application Priority Data

Feb. 17, 2020 (KR) .................. 10-2020-0019003

(51) Int. Cl.
*H01L 29/06* (2006.01)
*H01L 27/088* (2006.01)

(52) U.S. Cl.
CPC ...... *H01L 29/0619* (2013.01); *H01L 27/0886* (2013.01); *H01L 29/0649* (2013.01)

(58) Field of Classification Search
CPC ........... H01L 23/585; H01L 21/823481; H01L 23/552; H01L 23/564; H01L 29/0619; H01L 27/0886; H01L 21/823431; H01L 29/0673; H01L 29/78696; H01L 29/785; H01L 29/41791; H01L 2924/00; H01L 2225/06541; H01L 23/481; H01L 23/485; H01L 23/522; H01L 23/5226; H01L 23/53295; H01L 24/19; H01L 24/24; H01L 27/14636; H01L 21/823475;
(Continued)

(56) References Cited

U.S. PATENT DOCUMENTS

| 8,723,225 B2 | 5/2014 | Hu et al. |
| 9,589,912 B1 | 3/2017 | Lang et al. |
| 9,679,896 B2 | 6/2017 | Yoon et al. |

(Continued)

FOREIGN PATENT DOCUMENTS

KR 1020130113750 10/2013

*Primary Examiner* — Shahed Ahmed
*Assistant Examiner* — Sun Mi Kim King
(74) *Attorney, Agent, or Firm* — F. CHAU & ASSOCIATES, LLC

(57) ABSTRACT

A semiconductor device includes a substrate; a guard ring disposed on the substrate and adjacent to an edge of the substrate; an integrated circuit structure surrounded by the guard ring and disposed on the substrate; and an insulating material structure disposed on a side surface of the guard ring, and wherein the guard ring includes a plurality of guard active structures on the substrate, a plurality of guard contact structures disposed on each of the plurality of guard active structures, and a guard interconnection structure disposed on a pair of guard contact structures adjacent to each other, among the plurality of guard contact structures, wherein each of the plurality of guard active structures includes a plurality of guard active fins spaced apart from each other.

7 Claims, 36 Drawing Sheets

(58) Field of Classification Search
CPC ............. H01L 29/0649; H01L 29/6681; H01L 29/42392; H01L 29/7855; B82Y 10/00
See application file for complete search history.

(56) References Cited

U.S. PATENT DOCUMENTS

| | | | |
|---|---|---|---|
| 9,972,603 | B2 | 5/2018 | Chu et al. |
| 10,263,066 | B2 | 4/2019 | Hiroi et al. |
| 10,325,861 | B2 | 6/2019 | Miccoli |
| 2012/0139060 | A1 | 6/2012 | Jeon et al. |
| 2013/0265086 | A1 | 10/2013 | Chang et al. |
| 2014/0367780 | A1* | 12/2014 | Hong .................. H01L 23/562 257/288 |
| 2016/0126281 | A1 | 5/2016 | Chien-Hao et al. |
| 2016/0172359 | A1* | 6/2016 | Yoon .................... H01L 29/402 257/401 |
| 2019/0157150 | A1* | 5/2019 | Park ................. H01L 21/76811 |
| 2019/0371743 | A1* | 12/2019 | Then .................... H01L 23/585 |

\* cited by examiner

SEMICONDUCTOR DEVICE INCLUDING GUARD RINGS

CROSS-REFERENCE TO RELATED APPLICATION

This U.S. non-provisional patent application claims priority under 35 U.S.C. § 119 to Korean Patent Application No. 10-2020-0019003 filed on Feb. 17, 2020 in the Korean Intellectual Property Office, the disclosure of which is incorporated by reference herein in its entirety.

TECHNICAL FIELD

The present disclosure relates to a semiconductor device, and more particularly, to a semiconductor device including guard rings.

DISCUSSION OF THE RELATED ART

As the demand for high performance, high speed, and/or multifunctionality in semiconductor devices has increased, the degree of integration of semiconductor devices has increased. When a semiconductor device having fine patterns for high integration density of semiconductor devices is manufactured, there is a demand for implementation of patterns having a fine widths or fine separation distances. In order to overcome the limitation of operating characteristics resulting from a small size of a planar metal oxide semiconductor field effect transistor (MOSFET), various efforts have been made to develop semiconductor devices including a fin field effect transistor (FinFET) having a three-dimensional channel.

SUMMARY

According to an exemplary embodiment of the inventive concept, a semiconductor device may include a substrate having a first region, a second region and a third region, the second region at least partially surrounding the first region and the third region at least partially surrounding the second region, an integrated circuit structure on the substrate in the first region, a first guard ring disposed on the substrate at least partially surrounding the integrated circuit structure in the second region, a second guard ring disposed on the substrate at least partially surrounding the first guard ring in the third region, and an insulating material structure on side surfaces of the first guard ring and the second guard ring. The integrated circuit structure may include a circuit active fin disposed on the substrate in the first region, a gate structure intersecting the circuit active fin, a source or drain region disposed on the circuit active fin adjacent to a side surface of the gate structure, a circuit contact structure disposed on the source or drain region, and a circuit interconnection structure disposed on the circuit contact structure. The first guard ring may include first guard active structures disposed on the substrate in the second region, a plurality of first guard contact structures disposed on each of the first guard active structures, and a first guard interconnection structure disposed on the plurality of first guard contact structures. The second guard ring may include second guard active structures disposed on the third region, second guard contact structures disposed on the second guard active structures, and at least one second guard interconnection structures disposed on the second guard contact structures. The source or drain region may be interposed between the circuit contact structure and the circuit active fin. Each of the first guard active structures may include first external active fins, spaced apart from each other, and first internal active fins spaced apart from each other and disposed between the first external active fins. In each of the first guard active structures, upper surfaces of a first group of the first external and internal active fins may at least partially overlap the insulating material structure in a vertical direction, and upper surfaces of a second group of the first external and internal active fins may be in contact with the plurality of first guard contact structures. The vertical direction may be perpendicular to an upper surface of the substrate in a plan view.

According to an exemplary embodiment of the inventive concept, each of the second guard active structures may include second external active fins and second internal active fins spaced apart from each other and disposed between the second external active fins. The second guard active structures include a pair of second guard active structures adjacent to each other and parallel to each other.

According to an exemplary embodiment of the inventive concept, a first group of the second guard contact structures may be in contact with the second internal active fins and the first group of the second guard contact structures may be spaced apart from the second external active fins which are adjacent to the second internal active fins. A second group of the second guard contact structures may be in contact with the second internal active fins and the second external active fins.

According to an exemplary embodiment of the inventive concept, an upper surface of an active fin, at least partially overlapping the insulating material structure in the vertical direction, among the first external active fins and first internal active fins, may be disposed on a higher level than an upper surface of an active fin that is in contact with the plurality of first guard contact structures.

According to an exemplary embodiment of the inventive concept, a difference in heights between a lower surface and an upper surface of each of the plurality of first guard contact structures may be greater than a difference in heights between a lower surface and an upper surface of the circuit contact structure. The upper surface of each of the plurality of first guard contact structures and the upper surface of the circuit contact structure may be disposed on the same level.

According to an exemplary embodiment of the inventive concept, a distance between one of the first internal active fins and one of the first external active fins adjacent to each other may be less than a distance between the first internal active fins adjacent to each other.

According to an exemplary embodiment of the inventive concept, in one of the first guard active structures, upper surfaces of the first internal active fins may be in contact with the plurality of first guard contact structures, respectively, and upper surfaces of the first external active fins may at least partially overlap the insulating material structures in the vertical direction.

According to an exemplary embodiment of the inventive concept, the first guard interconnection structure may be in contact with an upper surface of each of the plurality of first guard contact structures. The first guard interconnection structure may at least partially overlap the insulating material structure, which is disposed between the plurality of first guard contact structures, in the vertical direction.

According to an exemplary embodiment of the inventive concept, each of the plurality of first guard contact structures may include an upper region having a maximum width ranging from about 50 nm to about 60 nm and disposed adjacent to the first guard interconnection structure, and a lower region having a maximum width ranging from about 30 nm to about 40 nm and disposed adjacent to the first guard active structure.

According to an exemplary embodiment of the inventive concept, the insulating material structure may include an isolation region disposed on side surfaces of the first and second guard active structures, a first protective layer disposed on the isolation region covering the first and second guard active structures, and a second protective layer covering the first protective layer. Each of the first and second guard contact structures may be in contact with the first protective layer and the second protective layer.

According to an exemplary embodiment of the inventive concept, the semiconductor device may further include a conductive line overlapping the first and second guard rings and the insulating material structure in the vertical direction, and a plurality of vias connected to the first and second guard interconnection structures respectively may be disposed below the conductive line.

According to an exemplary embodiment of the inventive concept, the first guard ring may have a shape in which rectangular regions are repeatedly disposed adjacent to each other, in the plan view, and the second guard ring may have an uneven shape, in the plan view.

According to an exemplary embodiment of the inventive concept, the first guard ring having a curved shape may surround a corner portion of the first region, and the second guard ring having a curved shape may surround a corner portion of the second region.

According to an exemplary embodiment of the inventive concept, at least a portion of the first and second guard active structures may include a semiconductor stacked structure in which a silicon layer and a silicon-germanium layer are repeatedly stacked.

According to an exemplary embodiment of the inventive concept, a semiconductor device may include substrate, a guard ring disposed on the substrate and adjacent to an edge of the substrate, an integrated circuit structure surrounded by the guard ring and disposed on the substrate, and an insulating material structure disposed on a side surface of the guard ring. The integrated circuit structure may include a circuit active fin disposed on the substrate, a gate structure intersecting the circuit active fin, a source or drain region on the circuit active fin adjacent to a side surface of the gate structure, a circuit contact structure disposed on the source/drain region, and a circuit interconnection structure disposed on the circuit contact structure. The guard ring may include a plurality of guard active structures on the substrate, a plurality of guard contact structures disposed on each of the plurality of guard active structures, and a guard interconnection structure disposed on a pair of guard contact structures adjacent to each other, among the plurality of guard contact structures. The source or drain region may be disposed between the circuit contact structure and the circuit active fin. Each of the plurality of guard active structures may include a plurality of guard active fins spaced apart from each other. In each of the plurality of guard active structures, upper surfaces of a first group of the plurality of guard active fins may at least partially overlap the insulating material structure in a vertical direction, and upper surfaces of a second group of the plurality of guard active fins may be in contact with the plurality of guard contact structures. The vertical direction may be perpendicular to an upper surface of the substrate.

According to an exemplary embodiment of the inventive concept, the guard interconnection structure may at least partially overlap the pair of guard contact structures and the insulating material structure. The insulating material structure may be disposed between the pair of guard contact structures, in the vertical direction.

According to an exemplary embodiment of the inventive concept, each of the plurality of guard contact structures may have a width greater than a width of each of the circuit active fins. Each of the plurality of guard contact structures may be in contact with one of a pair of guard active fins adjacent to each other and may be spaced apart from the other one of the pair of guard active fins.

According to an exemplary embodiment of the inventive concept, a semiconductor device may include a substrate, an integrated circuit structure disposed on the substrate, a guard ring disposed on the substrate at least partially surrounding the integrated circuit structure, and an insulating material structure on a side surface of the guard ring. The integrated circuit structure may include a circuit active fin disposed on the substrate, a gate structure intersecting the circuit active fin, a source or drain region disposed on the circuit active fin adjacent to a side surface of the gate structure, a circuit contact structure disposed on the source or drain region, and a circuit interconnection structure disposed on the circuit contact structure. The guard ring may include a guard active structure including a plurality of guard active fins spaced apart from each other and disposed on the substrate, guard contact structures spaced apart from each other, and a guard interconnection structure disposed on the guard contact structures. The source or drain region may be disposed between the circuit contact structure and the circuit active fin. The guard interconnection structure may be in contact with the guard contact structures. The guard active structure may be in contact with the guard contact structures. The plurality of guard active fins may include a pair of guard active fins adjacent to each other, and one of the pair of guard active fins is in contact with one of the guard contact structures and the other one of the pair of guard active fins is not in contact with the guard contact structures.

According to an exemplary embodiment of the inventive concept, the insulating material structure may include an isolation region disposed on side surfaces of the plurality of guard active fins, a protective layer disposed on the isolation region, and an interlayer insulating layer disposed on the protective layer. The protective layer may cover an upper surface of a guard active fin of the plurality of guard active fins, which is not in contact with the guard contact structures, among the plurality of guard active fins.

According to an exemplary embodiment of the inventive concept, both side surfaces of the guard interconnection structure, opposing each other, may at least partially overlap upper surfaces of the guard contact structures that are adjacent to each other, in a vertical direction. An area between the both side surfaces of the guard interconnection structure may at least partially overlap the insulating material structure in the vertical direction. The vertical direction is perpendicular to an upper surface of the substrate.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
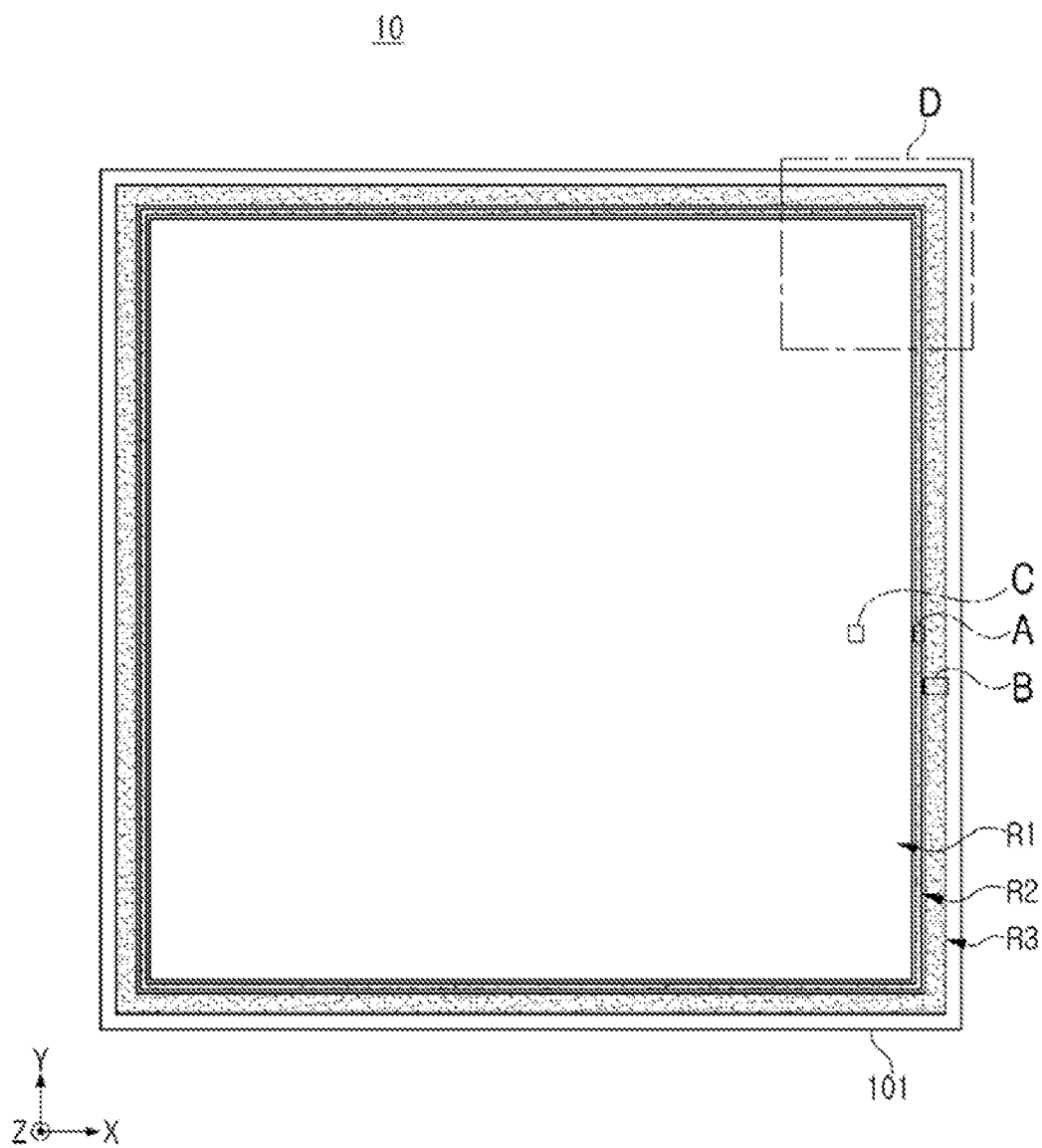
FIG. 1 is a plan view of a semiconductor device according to an exemplary embodiment of the inventive concept.

Herein, it will be understood that when an element of layer is referred to as being "on", "connected to", or "coupled to" another component, it can be directly on, connected or coupled to the other element or layer, or intervening elements or layers may be present.

Like reference numerals may refer to like elements throughout this specification. In the figures, the thickness of layers, films or regions may be exaggerated for clarity.

The term "and/or" includes any and all combinations of one or more of the associated listed items.

It will be understood that although the terms such as "first" and "second" are used herein to describe various elements, these elements should not necessarily be limited by these terms. The terms are only used to distinguish one component from other components. For example, a first element referred to as a first element in one embodiment may be referred to as a second element in another embodiment without departing from the scope of the appended claims. The singular forms, "a", "an" and "the" are intended to include the plural forms as well, unless the context clearly indicates otherwise.

Also, ""under", "below", "above', "upper", and the like are used for explaining relational association of components or elements illustrated in the drawings. The terms are intended to be a relative concept and are described based on directions as illustrated in the drawings Hereinafter, exemplary embodiments of the present inventive concept will be explained in detail with reference to the accompanying drawings.

Figure 2A:
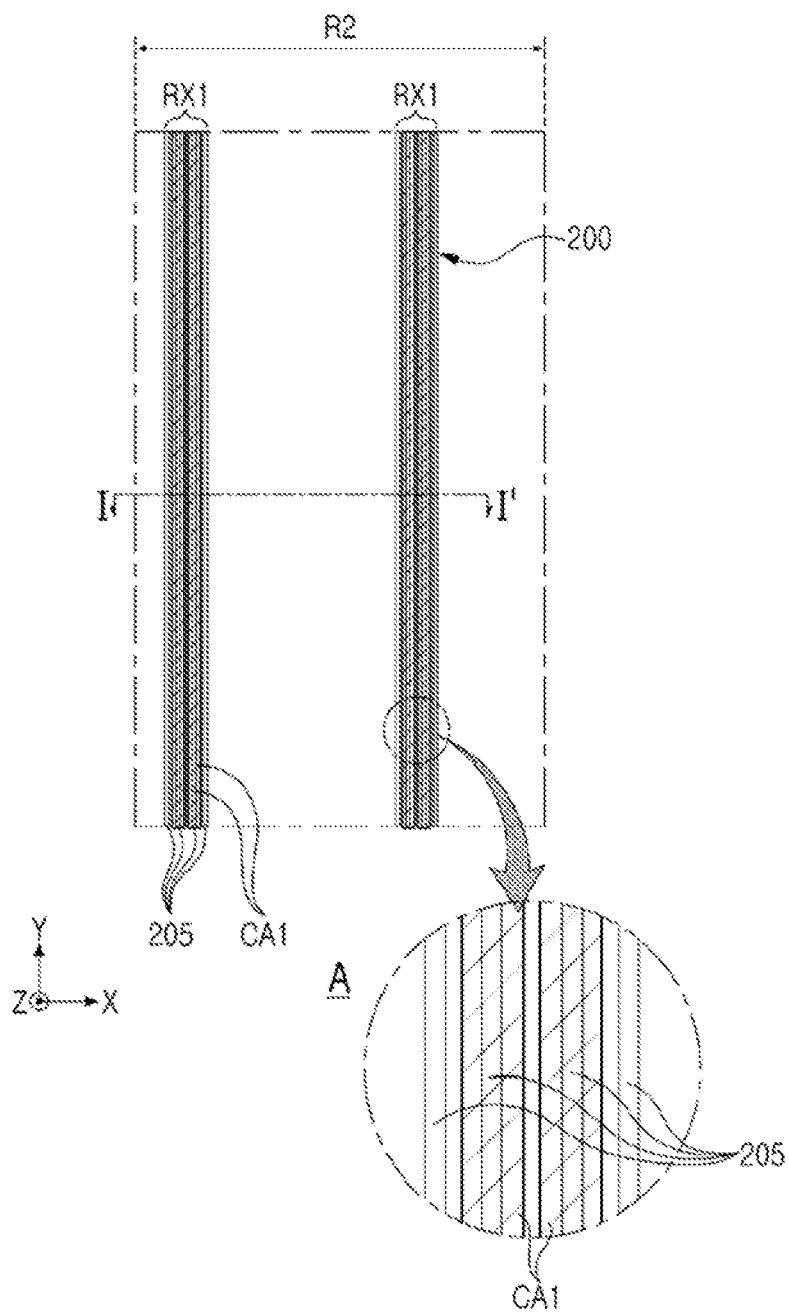
FIG. 2A is a partially enlarged view of a guard ring of a semiconductor device according to an exemplary embodiment of the inventive concept.
Figure 2B:
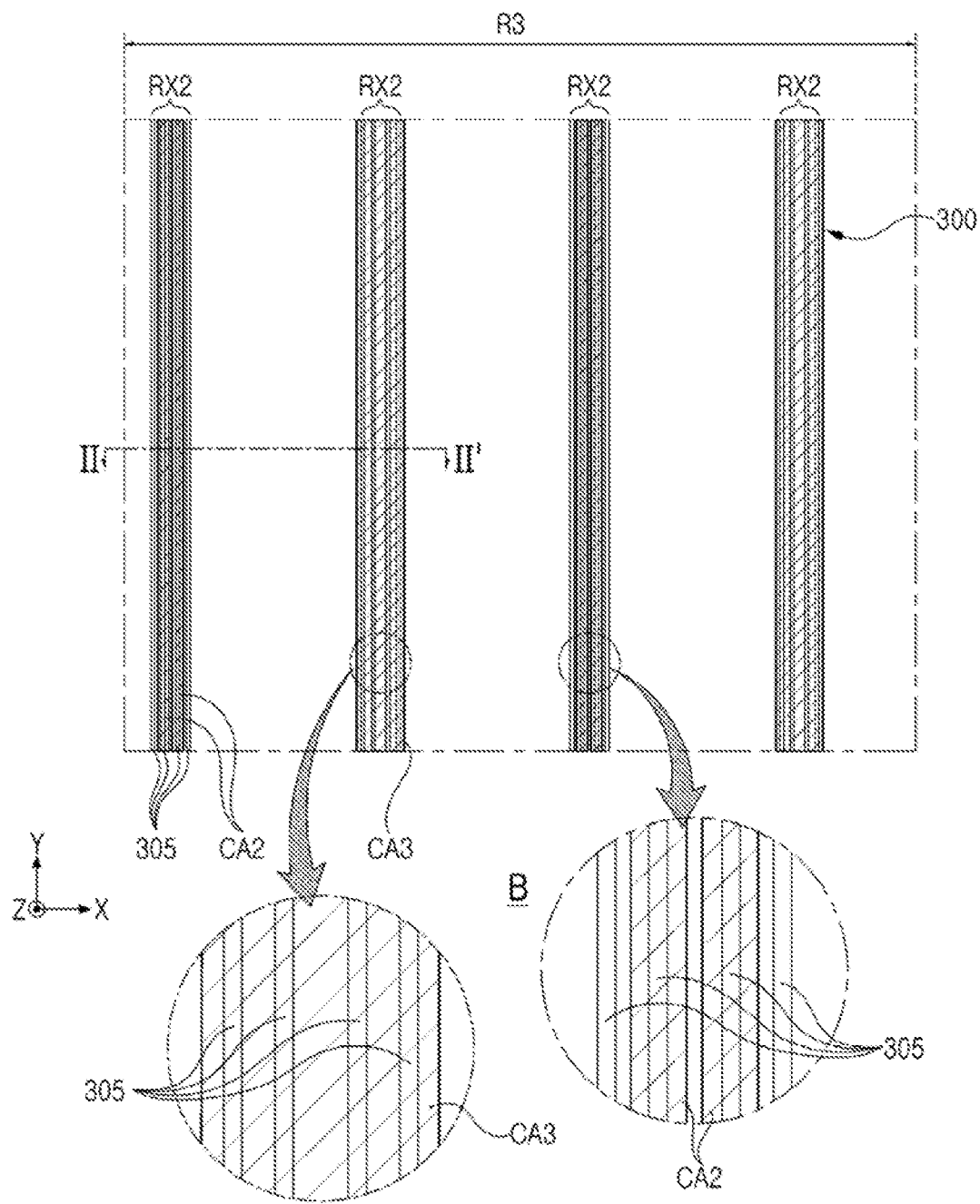
FIG. 2B is a partially enlarged view of a guard ring of a semiconductor device according to an exemplary embodiment of the inventive concept.
Figure 3A:
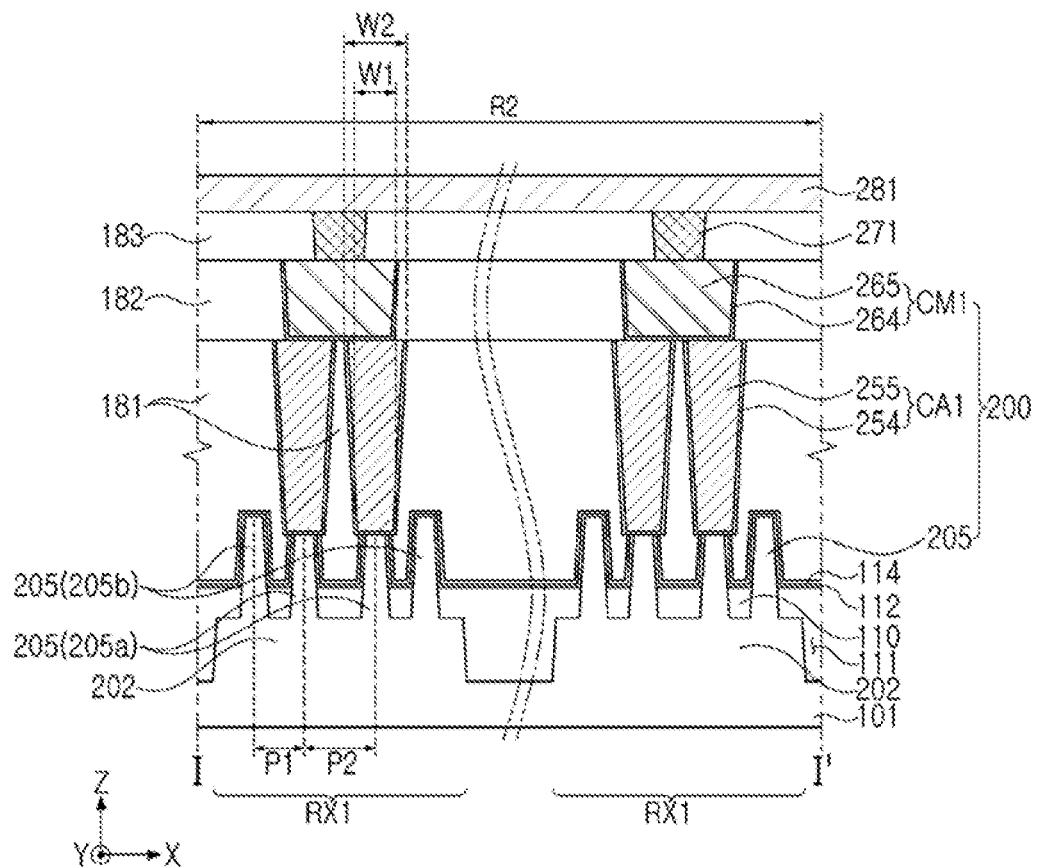
FIG. 3A is a cross-sectional view illustrating a guard ring of a semiconductor device according to an exemplary embodiment of the inventive concept.
Figure 3B:
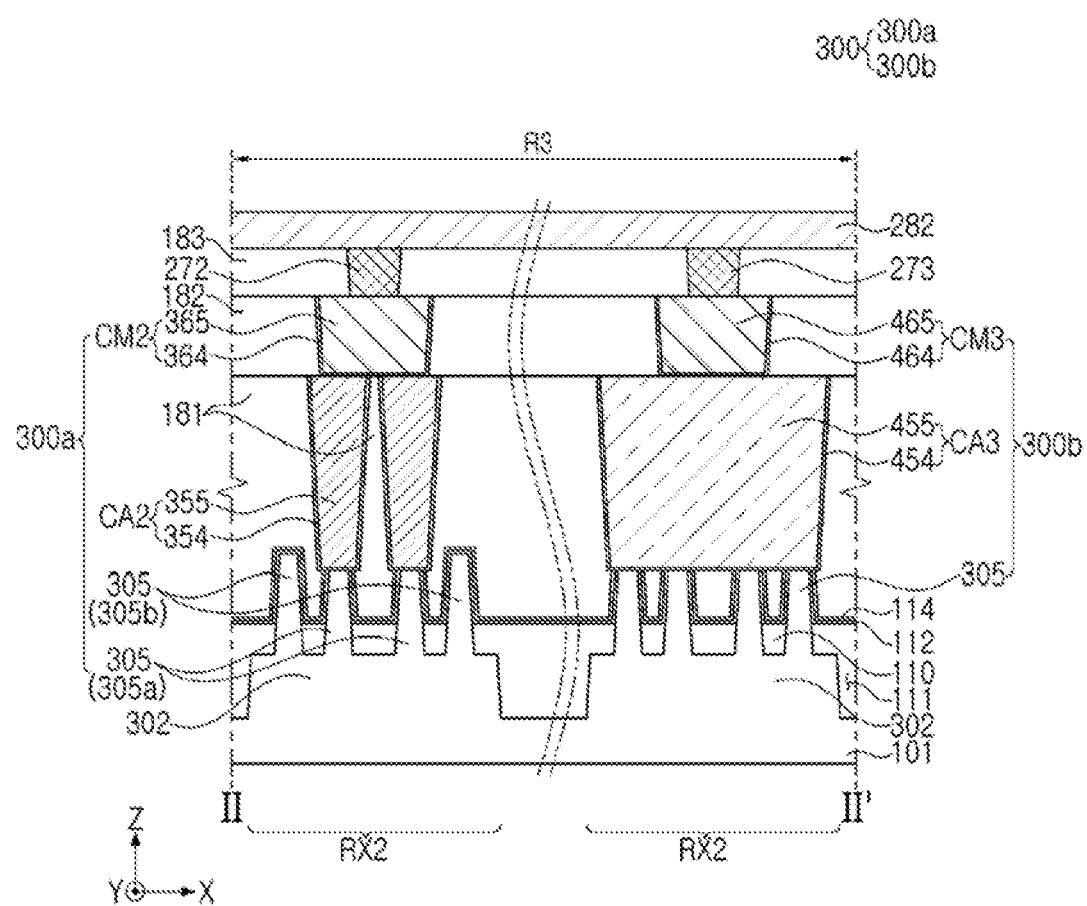
FIG. 3B is a cross-sectional view illustrating a guard ring of a semiconductor device according to an exemplary embodiment of the inventive concept.

A semiconductor device will be described with reference to FIGS. 1 to 3B. FIG. 1 is a plan view of a semiconductor device according to an exemplary embodiment of the inventive concept. FIG. 2A is an enlarged view of region 'A' in FIG. 1. FIG. 2B is a partially enlarged view of region 'B' in FIG. 1. FIG. 3A is a cross-sectional view taken along line I-I' in FIG. 2A. FIG. 3B is a cross-sectional view taken along line II-II' in FIG. 2B.

Referring to FIGS. 1 to 3B, a semiconductor device 10 may include a substrate 101 having a first region R1, a second region R2, and a third region R3, an integrated circuit structure 100 (see FIG. 4) on a substrate 101 of the first region R1, a first guard ring 200 on the substrate 101 of the second region R2, a second guard ring 300 on the substrate 101 of the third region R3. The first region R1 may be a central region of the substrate 101, the second region R2 may surround the first region R1, and the third region R3 may surround the second region R2. The semiconductor device 10 may include insulating material structures 110, 112, 114, 181, 182, 183, and 184 on side surfaces of the first and second guard rings 200 and 300. The insulating material structures 110, 112, 114, 181, 182, 183, and 184 include a isolation region 110, first and second protective layers 112 and 114, and first to fourth interlayer insulating layers 181, 182, 183, and 184.

The substrate 101 may include a semiconductor material such as a group IV semiconductor, a group III-V compound semiconductor, or a group II-VI compound semiconductor. For example, the group IV semiconductor may include silicon (Si), germanium (Ge), or silicon germanium (SiGe). The substrate 101 may be configured as a bulk wafer, a silicon on insulator (SOI) layer, a semiconductor on insulator (SeOI) layer, or the like.

Figure 7A:
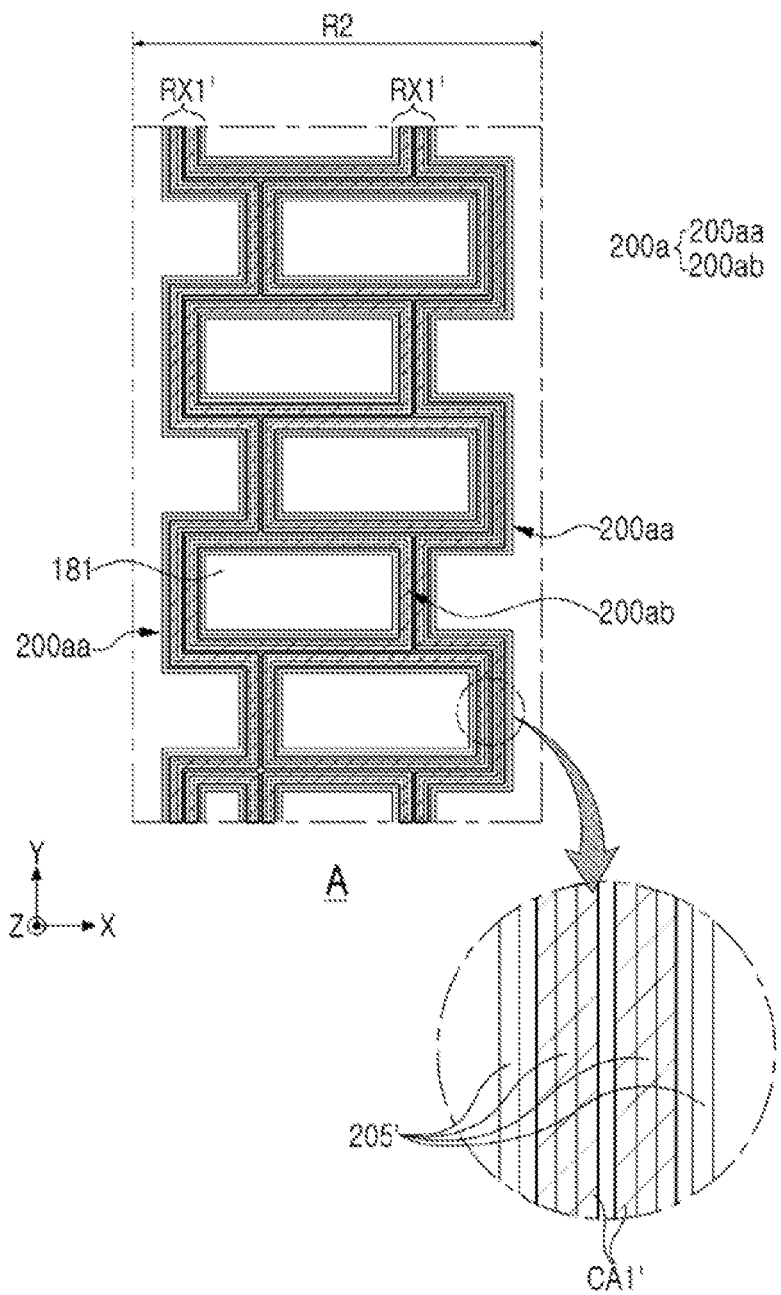
FIGS. 7A to 7C are partially enlarged views illustrating guard ring of a semiconductor device according to some exemplary embodiments of the inventive concept.

According an embodiment of the inventive concept, the first guard ring 200 may have a rectangular shape. However, a shape of the first guard ring 200 is not limited thereto and the first guard ring 200 may have any shape as long as it may surround the integrated circuit structure 100 of the first region R1. The first guard ring 200 may include a plurality of first guard rings 200 which are arranged side by side outwardly of the first region R1 from the center of the first region R1. However, the present disclosure is not limited thereto and, as illustrated in FIG. 7A, the first guard ring 200 has repetitive patterns and may be disposed to surround the first region R1. The first guard ring 200 may be adjacent to an edge of the substrate 101.

The first guard ring 200 may include first guard active fins 205 surrounding the first region R1 and extending on the second region R2, a first guard contact structure CA1 on the first guard active fins 205, and a first guard interconnection structure CM1 on the first guard contact structure CA1.

The first guard active fins 205 may have a fin structure and may be defined by the isolation region 110 in the substrate 101. The first guard active fins 205 may have a structure protruding from the substrate 101. Upper ends of the first guard active fins 205 may protrude to a predetermined height from an upper surface of the isolation region 110. The first guard active fins 205 may be formed as a portion of the substrate 101 or may include an epitaxial layer grown from the substrate 101. The first guard active fins 205 may have widths, heights, and spacings different from or the same as those of circuit active fins 105 of the integrated circuit structure 100 (referring to FIGS. 4 to 5C). For example, the first guard active fins 205 may have a greater width than the circuit active fins 105 of the integrated circuit structure 100.

Among the first guard active fins 205, a pair of first guard active fins 205 adjacent to each other may include one first guard active fin 205, which may be in contact with one of the first guard contact structures CA1, and the other first guard active fin 205 which might not be in contact with the first guard contact structure CA1.

Among the first guard active fins 205, a plurality of first guard active fins 205 may be arranged side by side. The plurality of first guard active fins 205, arranged side by side, may form a first guard active structure RX1 together with a first guard active region 202. A plurality of first guard active structures RX1 may be arranged side by side. The first guard active structure may be designated as RX1' in the accompanying drawings (referring to FIG. 7A).

In a first guard active structure RX1 among the plurality of first guard active structures RX1, upper surfaces of the first internal active fins 205a and the first guard contact structures CA1 may be in contact with each other, and upper surfaces of first external active fins 205b may at least partially overlap the insulating material structures 110, 112, 114, 181, 182, 183, and 184 in a vertical direction. The vertical direction may be a direction perpendicular to an upper surface of the substrate 101, for example, a Z direction.

The first guard active structure RX1 may include first external active fins 205b, spaced apart from each other, and first internal active fins 205a spaced apart from each other between the first external active fins 205b. In each of the first guard active structures RX1, upper surfaces of some of the first external and internal active fins 205b, 205a may at least partially overlap the insulating material structures 110, 112, 114, 181, 182, 183, and 184 in the vertical direction (the Z direction). Upper surfaces of the others of the first external and internal active fins 205b, 205a may be in contact with the first guard contact structures CA1.

According to an embodiment of the inventive concept, an upper surface of the guard active fin overlapping the insulating material structures 110, 112, 114, 181, 182, 183, and 184 in the vertical direction (the Z direction), among the first external and internal active fins 205b and 205a, may be disposed at a level higher than an upper surface of the guard active fin that is in contact with the contact structures CA1.

A distance between the first internal active fins 205a and the adjacent first external active fins 205b may be less than a distance between the first internal active fins 205a adjacent to each other.

According to an exemplary embodiment of the inventive concept, the first guard active structure RX1 may include a single guard active fin or a plurality of guard active fins, and the number, arrangement, width, and spacing of the active fins are not limited to those illustrated in the drawings.

The isolation region 110 may be configured to have the first guard active fins 205 disposed on the substrate 101. The isolation region 110 may be formed by, for example, a shallow trench isolation (STI) process. The isolation region 110 may expose upper sidewalls of the first guard active fins 205. According to an exemplary embodiment, the isolation region 110 may include a deep isolation region 111 extending deeper to a lower portion of the substrate 101 between the first guard active fins 205. The isolation region 110 may have a curved upper surface having a higher level in a direction toward the first guard active fins 205. However, a shape of the upper surface of the isolation region 110 is not limited thereto. The isolation region 110 may be formed of an insulating material. The isolation region 110 may include, for example, an oxide, a nitride, or a combination thereof.

The first guard contact structures CA1 may be configured to include a plurality of first guard contact structures CA1. The plurality of first guard contact structures CA1 may be disposed on each of the first guard active structures RX1. Each of the first guard contact structures CA1 may penetrate through the first interlayer insulating layer 181 to be in contact with at least two of the first internal and external active fins 205a and 205b. The first guard contact structures CA1 may be spaced apart from each other in an X direction to be contact in contact with the first internal active fins 205a, respectively. The first guard contact structure CA1 may be in contact with the first guard active fins 205 by recessing upper portions of the first guard active fins 205. A lower end of the first guard contact structure CA1 may be disposed below an uppermost end of the first guard active fins 205. The first guard contact structure CA1 may have an inclined side surface in which a width of a lower portion is narrower than a width of an upper portion according to an aspect ratio, but the present disclosure is not limited thereto.

Figure 4:
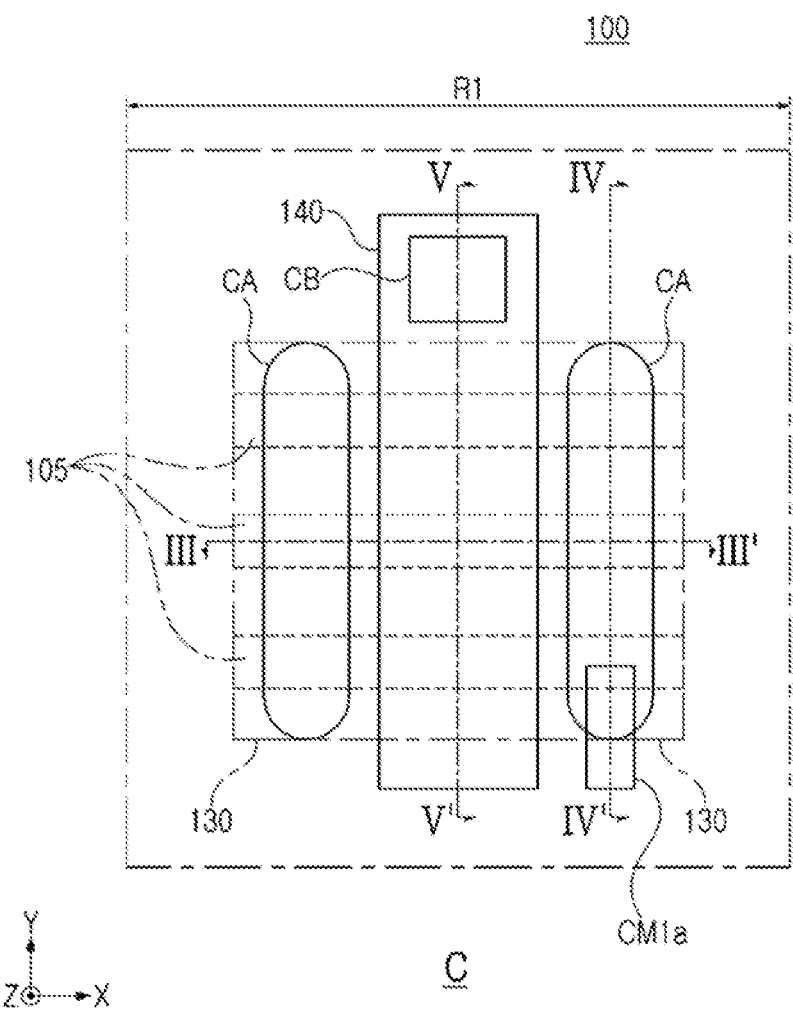
FIG. 4 is a partially enlarged view of a semiconductor device according to an exemplary embodiment of the inventive concept.

A difference in heights between the lower surface and the upper surface of the first guard contact structure CA1 may be greater than a difference in heights between the lower surface and the upper surface of the circuit contact structure CA (referring to FIG. 4). The upper surface of the first guard contact structure CA1 and the upper surface of the circuit contact structure CA may be disposed at the same level.

The first guard contact structure CA1 may be disposed to overlap at least a portion of the first guard active fins 205 in a direction perpendicular to the upper surface of the substrate 101. The first guard contact structure CA1 may have a shape corresponding to the first guard active fins 205, when in a plan view. For example, when the first guard active fins 205 have a shape of a line extending in one direction, for example, a Y direction, the first guard contact structure CA1 may also overlap at least a portion of the first guard active fins 205 and may have a shape of a line extending in the Y direction.

The first guard contact structure CA1 may form a pair on one first guard active structure RX1. For example, a single first guard active structure RX1 may include at least two active fins, and each of a pair of first guard contact structures CA1 may be connected to first guard active fins 205 adjacent to each other, respectively. Each of the first guard contact structures CA1 may be in contact with one of the pair of first guard active fins 205 adjacent to each other and may be spaced apart from the other active fin.

Referring to FIG. 3A, the first guard active structure RX1 may include, for example, four active fins. The four active fins may be a first active fin, a second active fin, a third active fin, and a fourth active fin, sequentially arranged from left to right in the X direction. However, the present disclosure is not limited thereto. According to an exemplary embodiment of the inventive concept, the first guard active structure RX1 may include a single active fin or a plurality of active fins, and the number of active fins may be changed. In an exemplary embodiment, the pair of first guard contact structures CA1 may be connected to the second active fin and the third active fin, respectively. According to an embodiment, the first interlayer insulating layer 181 may be disposed between the pair of first guard contact structures CA1 and between the second and third active fins below the first guard interconnection structure CM1.

A distance between a center of the first active fin and a center of the second active fin in an X direction is referred to as a first pitch P1. The first pitch P1 may be the same as a distance between a center of the third active fin and a center of the fourth active fin in the X direction. The distance between the center of the second active fin and the center of the third active fin in the X direction may be referred to as a second pitch P2. According to an embodiment of the inventive concept, the second pitch P2 may be greater than the first pitch P1.

A width of a lower end of the first guard contact structure CA1 in the X direction may be referred to as a first width W1. A width of an upper end of the first guard contact structure CA1 in the X direction may be referred to as a second width W2. The second width W2 may be greater than the first width W1. According to an embodiment of the inventive concept, the first width W1 may be greater than a width of each of the first guard active fins 205. The first width W1 of the first guard contact structure CA1 may be smaller than the first pitch P1 and the second pitch P2. However, the present disclosure is not limited thereto, and the first width W1 of the first guard contact structure CA1 may be greater than the first pitch P1 and smaller than the second pitch P2. According to an embodiment of the inventive concept, a width of each of the first guard contact structures CA1 may be greater than a width of each of the circuit active fins 105.

In an exemplary embodiment of the inventive concept, the first guard contact structure CA1 may have an upper region, having a maximum width ranging from about 50 nm to about 60 nm and disposed to be adjacent to the first guard interconnection structure CM1, and a lower region having a maximum width ranging from about 30 nm to about 40 nm and disposed to be adjacent to the first guard active structure RX1.

A size of the first guard contact structure CA1 may be different from a size of the circuit contact structure CA (referring to FIGS. 4 to 5C) of the integrated circuit structure 100. For example, the size of the first guard contact structure CA1 may be larger than the size of the circuit contact structure CA. In an exemplary embodiment, referring to FIG. 5B, the circuit contact structure CA may have an upper region, having a maximum width ranging from about 10 nm to about 30 nm and an upper region and disposed to be adjacent to the circuit interconnection structure CM1a, and a lower region having a maximum width ranging from about 10 nm to about 15 nm and disposed to be adjacent to the circuit active fins 105.

When the first guard contact structure CA1 forms a pair on one first guard active structure RX1, a size of a first guard contact hole GH1 for forming the first guard contact structure CA1 (see FIG. 13A) may be reduced. Accordingly, an insulating residue generated in an etching process of FIG. 13A may be prevented from being deposited in a first guard contact hole GH1, and a poor contact between the first guard contact structure CA1 and the first guard active fins 205 may be prevented.

The first guard contact structure CA1 may include a first guard barrier layer 254 and a first guard contact plug 255. The first guard barrier layer 254 may surround the first guard contact plug 255. The first guard barrier layer 254 may cover a side surface and a lower surface of the first guard contact plug 255. The first guard barrier layer 254 may be disposed between the first guard active fins 205 and the first guard contact plug 255.

The first guard barrier layer 254 may be formed of a metal nitride such as titanium nitride (TiN), tantalum nitride (TaN), or tungsten nitride (WN). The first guard contact plug 255 may be formed of, for example, tungsten (W), cobalt (Co), titanium (Ti), an alloy thereof, or a combination thereof.

The protective layers 112 and 114 may be disposed on side surfaces of the first guard ring 200. The protective layers 112 and 114 may conformally cover the first guard active fins 205 and the isolation region 110. The protective layers 112 and 114 may include a first protective layer 112, covering the first guard active fins 205 and the isolation region 110, and a second protective layer 114 covering the first protective layer 112. According to an exemplary embodiment of the inventive concept, the protective layers 112 and 114 may be disposed on side surfaces of the first guard active structure RX1 and a second guard active structure RX2. The protective layers 112 and 114 may be used to protect the first and second guard active fins 205 and 305 in a second region R2 and a third region R3 during a process of manufacturing the integrated circuit structure 100 in a first region R1. In one embodiment of the inventive concept, the first protective layer 112 may be disposed on the isolation region 110 and may cover the first guard active structures RX1 and the second guard active structures RX2.

Each of the first guard contact structure CA1 and the second guard contact structure CA2 may be in contact with the protective layers 112 and 114. At least a portion of the protective layers 112 and 114 may be in contact with a lower end of the first guard contact structure CA1. The first interlayer insulating layer 181 may at least partially cover the protective layers 112 and 114. The protective layers 112 and 114 may cover an upper surface of the first guard active fin 205, which is not in contact with the first guard contact structure CA1, among the first guard active fins 205.

The protective layers 112 and 114 may be formed of an oxide, a nitride, and an oxynitride. For example, the protective layers 112 and 14 may include at least one of SiO, SiN, SiCN, SiOC, SiON, and SiOCN. In an exemplary embodiment, the first protective layer 112 may include a silicon oxide, and the second protective layer 114 may include a silicon nitride. The second protective layer 114 may include the same material as an etch-stop layer 135 (see FIG. 5B) of the integrated circuit structure 100.

In an embodiment of the inventive concept, a gate structure extending across the first guard active fins 205 and the second guard active fins 305 might not be disposed on the second region R2 and the third region R3. A gate structure 140 (referring to FIGS. 4 to 5C) may be disposed to extend across the active fins 105 only on the first region R1.

The first guard interconnection structure CM1 may electrically connect the pair of first guard contact structures CA1 through the second interlayer insulating layer 182. The first guard interconnection structure CM1 may have an inclined side surface in which a width of a lower portion is narrower than a width of an upper portion according to an aspect ratio. However, the present disclosure is not limited thereto. The first guard interconnection structure CM1 may be in contact with an upper surface of the first guard contact structure CA1. The first guard interconnection structure CM1 may at least partially overlap the insulating material structures 110, 112, 114, and 181 disposed between the first guard contact structures CA1 in the Z direction.

A first interlayer insulating layer 181 may be disposed between a pair of first guard contact structures CA1 below the first guard interconnection structure CM1. At least a portion of the lower end of the first guard interconnection structure CM1 may be in contact with an upper surface of the first interlayer insulating layer 181.

Both side surfaces of the first guard interconnection structure CM1, opposing each other, may at least partially overlap upper surfaces of the first guard contact structure CA1 adjacent to each other in the vertical direction (the Z direction). An area between both side surfaces of the first guard interconnection structure CM1 may overlap the insulating material structures 110, 112, 114, and 181 in the vertical direction (Z direction).

The first guard interconnection structure CM1 may include a first conductive barrier layer 264 and a first guard interconnection layer 265. The first conductive barrier layer 264 may surround the first guard interconnection layer 265.

According to an embodiment of the inventive concept, the first conductive barrier layer 264 may surround a side surface and a lower surface of the first guard interconnection layer 265.

The first conductive barrier layer 264 may be formed of a metal nitride such as titanium nitride (TiN), tantalum nitride (TaN), or tungsten nitride (WN). The first guard interconnection layer 265 may be formed of, for example, tungsten (W), cobalt (Co), titanium (Ti), an alloy thereof, or a combination thereof.

In an embodiment of the inventive concept, a first via 271 on the first guard interconnection structure CM1 of the first guard ring 200 and a first conductive line 281 on the first via 271 may be further provided. The first conductive line 281 may overlap the first and second guard rings 200 and 300 and the insulating material structures 110, 112, 114, 181, 182, and 183 in the vertical direction (Z direction). The first via 271 may be connected to each of the first and second guard interconnection structures CM1 and CM2 below the first conductive line 281.

The first conductive line 281 and other upper interconnections connected thereto might not be electrically connected to other upper interconnections on the integrated circuit structure 100. Current, flowing to the first conductive line 281 and other upper interconnections connected thereto, may be grounded to the substrate 101 through the first guard ring 200 including the first guard active fins 205, the first guard contact structure CA1, and the first guard interconnection structure CM1. Thus, electrostatic current which may flow into the integrated circuit structure 100 from the externals may be significantly reduced and the integrated circuit structure 100 may be prevented from being damaged.

According to an embodiment of the inventive concept, the second guard ring 300) may a rectangular shape. However, a shape of the second guard ring 300 is not limited thereto and the second guard ring 300 may have any shape as long as it may surround the first guard ring 200 of the second region R2.

Figure 7B:
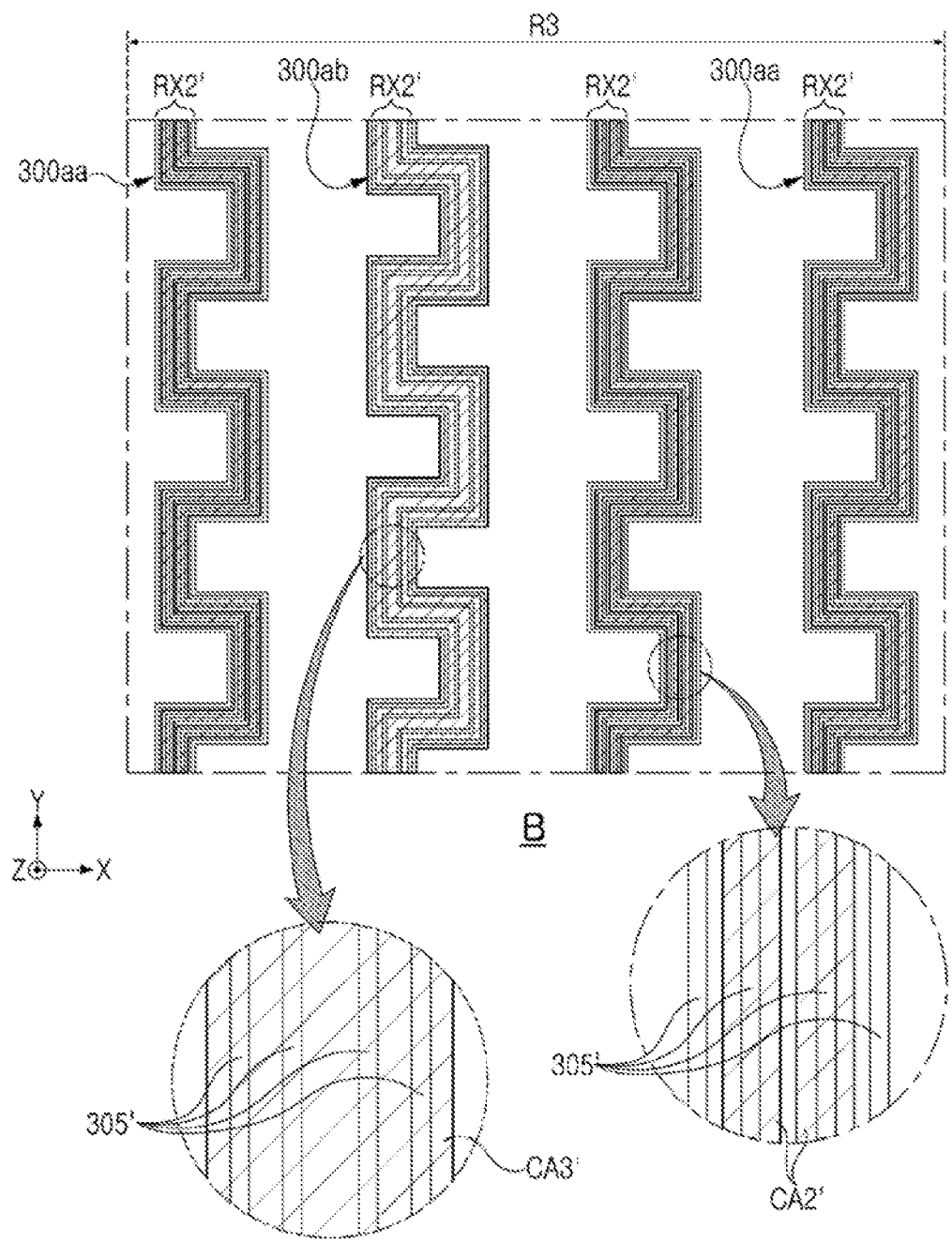
Figure 7C:
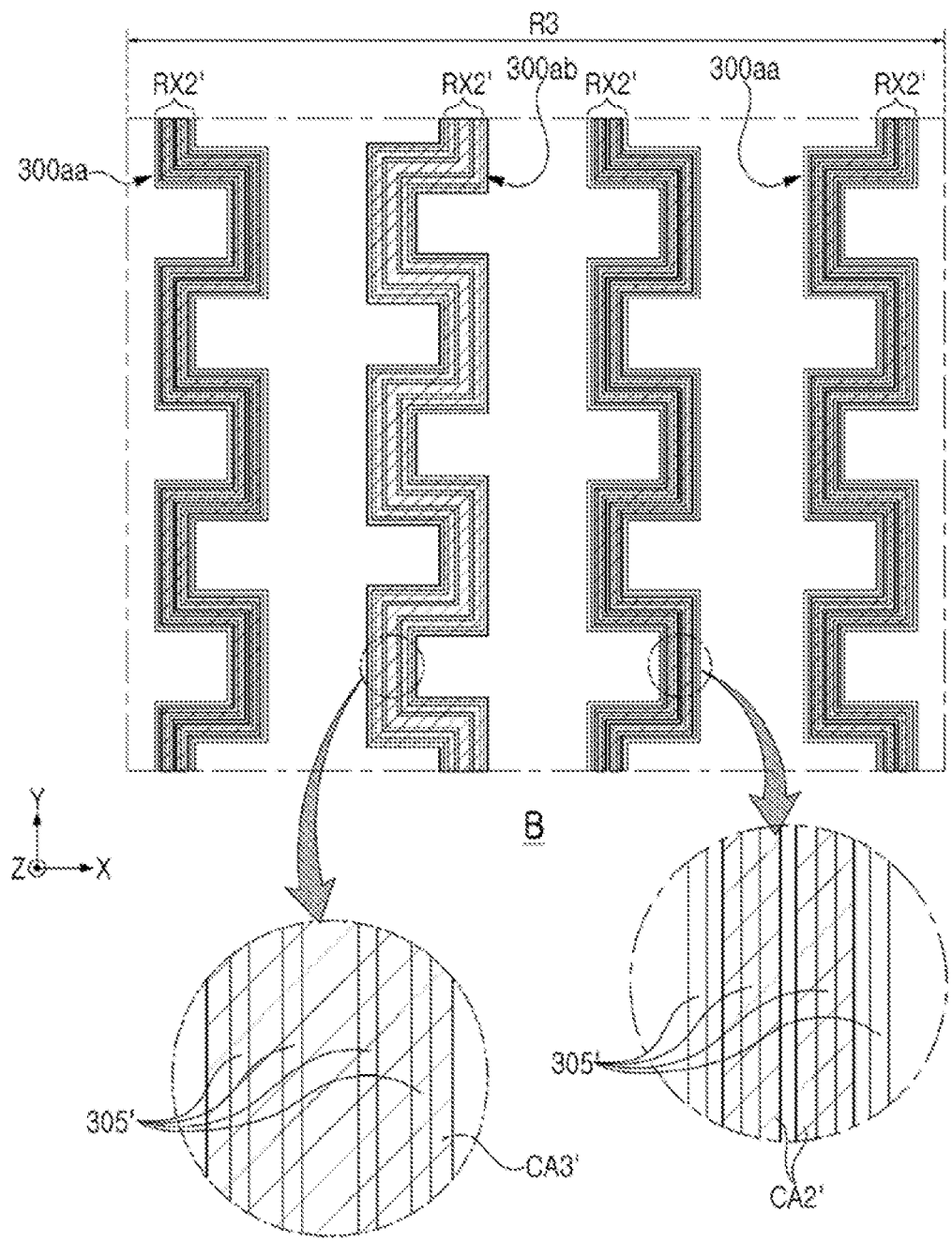

The second guard ring 300 may be configured to have a plurality of second guard rings. The second guard ring 300 may be arranged in a larger number of lines than the first guard rings 200, and may be arranged more densely than the first guard ring 200. The second guard rings 300 may be arranged side by side to be outwardly of the first region R1 from the center of the first region R1. However, the present disclosure is not limited thereto and, as illustrated in FIG. 7B or 7C, the second guard ring 300 may be formed to have a shape in which unevenness is repeated. The second guard ring 300 may be adjacent to the edge of the substrate 101.

In an exemplary embodiment of the inventive concept, 'n' first guard rings 200 may be arranged side by side on the second region R2, and 'm' second guard rings 300 may be arranged side by side on the third region R3. According to an embodiment, 'm' may be greater than 'n'. In the present inventive concept, 'n' means the number of the first guard rings 200 and 'm' means the number of the second guard rings 300.

The second guard ring 300 may include second guard active fins 305 extending on the third region R3, a second guard contact structure CA2 on the second guard active fins 305, and a second guard interconnection structure CM2 on the second guard contact structure CA2. The second guard contact structure CA2 may be connected to the second guard active fins 305 through the first interlayer insulating layer 181. The second guard interconnection structure CM2 may be connected to the second guard contact structure CA2 through the second interlayer insulating layer 182.

Referring to FIG. 3B, some 300a of the second guard ring 300 may have the same (or similar) structure as the first guard ring 200.

For example, a plurality of second guard active fins 305 may constitute a second guard active structure RX2 together with the second guard active region 302. The second guard active structure RX2 may include second internal active fins 305a between second external active fins 305b and second external active fins 305b. Each of the second guard contact structures CA2 may be spaced apart from each other to be in contact with the second internal active fins 305a, respectively. The second guard active structures RX2 may include a pair of second guard active structures RX2 adjacent to each other and parallel to each other. In some places throughout the specification, the second guard active structures may be designated as RX2' (referring to FIG. 7B, 7C).

According to an embodiment of the inventive concept, the second guard contact structure CA2 may include a second guard barrier layer 354 and a second guard contact plug 355, and the second guard interconnection structure CM2 may include a second conductive barrier layer 364 and a second guard interconnection layer 365.

According to an embodiment of the inventive concept, a single second guard interconnection structure CM2 or a plurality of second guard interconnection structures CM2 may be disposed on the second guard contact structures CA2.

In the second guard active fins 305, the second guard contact structure CA2, and the second guard interconnection structure CM2 of the second guard ring 300, elements corresponding to the first guard active fins 205, the first guard contact structure CA1, and the first guard interconnection structure CM1 will be designated by the same or similar reference numerals of the first guard ring, or to the extend that a description of an element has been omitted, it may be assumed that the description is at least similar to that of corresponding elements that have been described elsewhere in the instant specification.

However, the second guard ring 300 may include a greater number of guard active fins than the first guard ring 200. For example, the number of second guard active structures RX2 may be greater than the number of first guard active structures RX1. The number of second guard contact structures CA2 may be greater than the number of first guard contact structures CA1.

Referring to FIG. 3B, the others 300b of the second guard ring 300 may have a structure different from a structure of the first guard ring 200. The others 300b of the second guard ring 300 may include a third guard contact structure CA3 and a third guard interconnection structure CM3.

Unlike the second guard contact structure CA2, the third guard contact structure CA3 may be connected to all of the second guard active fins 305 constituting a single second guard active structure RX2. For example, the second guard contact structure CA2 may be in contact with the second internal active fins 305a and may be spaced apart from the second external active fins 305b adjacent to the second internal active fins 305a, while the third guard contact structure CA3 may be in contact with the second internal active fins 305a and the second external active fins 305b.

Unlike the second guard interconnection structure CM2, the third guard interconnection structure CM3 may be connected to a third guard contact structure CA3.

The third guard contact structure CA3 may include a third guard barrier layer 454 and a third guard contact plug 455, and will be designated by the same or similar reference numerals of the second guard barrier layer 354 and the second guard contact, respectively, or to the extend that a description of an element has been omitted, it may be assumed that the description is at least similar to that of corresponding elements that have been described elsewhere in the instant specification.

The third guard interconnection structure CM3 may include a third conductive barrier layer 464 and a third guard interconnection layer 465, and will be designated by the same or similar components of the second conductive barrier layer 364 and the second guard interconnection layer 365 or to the extend that a description of an element has been omitted, it may be assumed that the description is at least similar to that of corresponding elements that have been described elsewhere in the instant specification.

In an embodiment of the inventive concept, a second via 272 on the second guard interconnection structure CM2 of the second guard ring 300 and a second conductive line 282 on the second via 272 may be further provided. The second via 272 may be disposed on the second guard interconnection structure CM2. The second conductive line 282 and other upper interconnections connected thereto might not be electrically connected to other upper interconnections on the integrated circuit structure 100.

In an embodiment of the inventive concept, a third via 273 may be disposed on the third guard interconnection structure CM3 of the second guard ring 300. The second conductive line 282 may be disposed on the third via 273. The second conductive line 282 and other upper interconnections connected thereto might not be electrically connected to other upper interconnections on the integrated circuit structure 100.

After manufacturing a plurality of semiconductor devices on a wafer through the second guard ring 300 including the second guard active fins 305, the second guard contact structure CA2, and the second guard interconnection structure CM2, an integrated circuit including a plurality of transistors may be protected to prevent moisture from permeating the integrated circuit or to prevent cracking from occurring in the integrated circuit.

In an embodiment of the inventive concept, the number of each of the second guard rings 300a and 300b arranged in FIGS. 2B and 3B may be variously changed. The second guard ring 300a including the second guard contact structure CA2 and the second guard ring 300b including the third guard contact structure CA3 may each include a plurality of second guard rings, and only one of the second guard ring 300a and the second guard ring 300b may include a plurality of second guard rings.

Figure 5A:
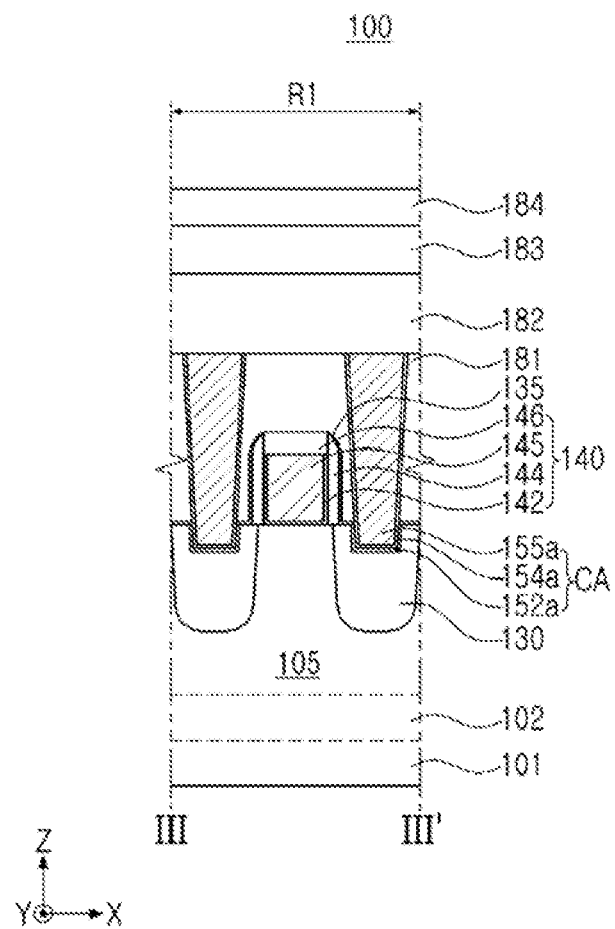
FIGS. 5A to 5D are cross-sectional views of a semiconductor device according to some exemplary embodiments of the inventive concept.
Figure 5B:
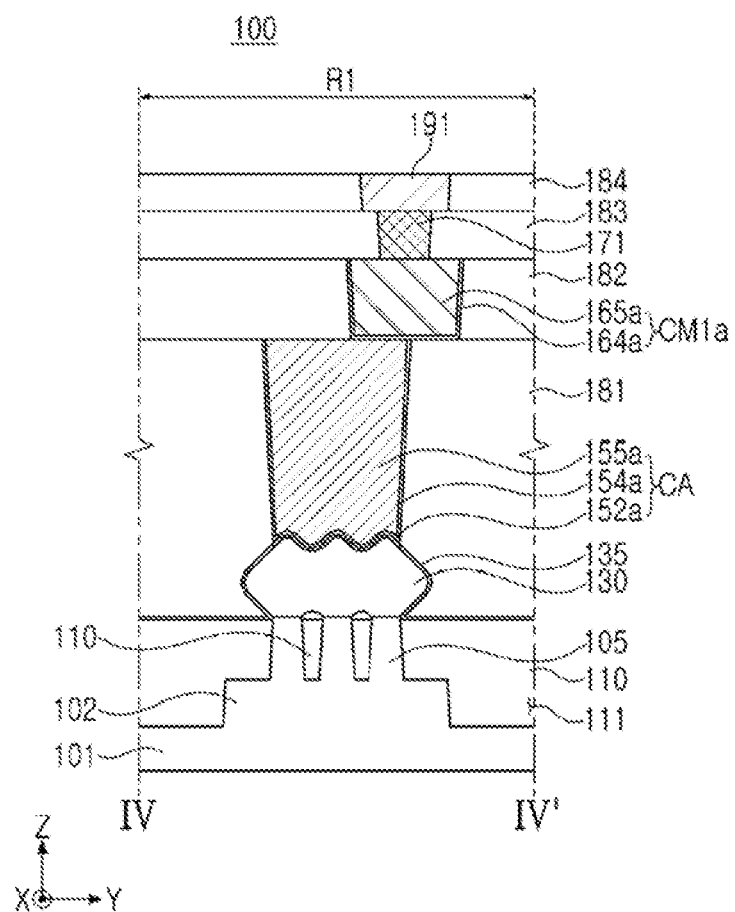
Figure 5C:
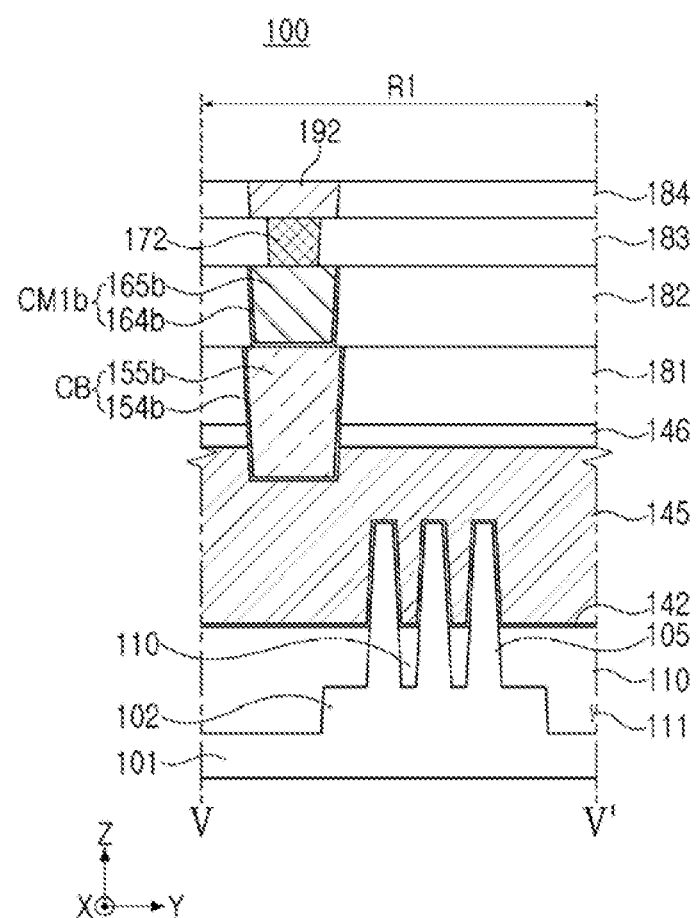

An integrated circuit structure of a semiconductor device will be described with reference to FIGS. 4 to 5C. FIG. 4 is an enlarged view of region 'C' in FIG. 1. FIG. 5A is a cross-sectional view taken along line III-III' in FIG. 4. FIG. 5B is a cross-sectional view taken along line IV-IV' in FIG. 4. FIG. 5C is a cross-sectional view taken along line V-V in FIG. 4.

Referring to FIGS. 4 to 5C, an integrated circuit structure 100 of the semiconductor device 10 may include circuit active fins 105 on the substrate 101 of the first region R1, a isolation region 110 defining the circuit active fins 105, a gate structure 140 extending across the circuit active fins 105, and source/drain regions 130 on the circuit active fins 105 adjacent to a side surface of the gate structure 140.

In the integrated circuit structure 100, the circuit active fins 105 may be a fin field effect transistor (FinFET), a transistor in which a channel region of the transistor is formed in the circuit active fins 105 intersecting the gate structure 140. The circuit active fins 105 may be disposed on active regions 102 in the integrated circuit structure 100. The active regions 102 may be defined by a deep isolation region 111. The active regions 102 may extend in the X direction. The circuit active fins 105 may protrude from the active regions 102 in the Z direction. In the structure of the circuit active fins 105, the same parts as the structure of the first guard active fins 205 will be designated by the same or similar reference numerals or to the extend that a description of an element has been omitted, it may be assumed that the description is at least similar to that of corresponding elements that have been described elsewhere in the instant specification. However, a portion of the circuit active fins 105 on the substrate 101 may be recessed on both sides of the gate structure 140, and source/drain regions 130 may be disposed on the recessed circuit active fins 105. According to an exemplary embodiment, the circuit active fins 105 may include impurities, and at least a portion of the circuit active fins 105 may include impurities of different conductivity types to each other, but the present disclosure is not limited thereto.

The isolation region 110 may define the circuit active fins 105 on the substrate 101. In the isolation region 110 and the circuit active fins 105, the same parts as the isolation region 110 and the first guard active fins 205 will be designated by the same or similar reference numerals or to the extend that a description of an element has been omitted, it may be assumed that the description is at least similar to that of corresponding elements that have been described elsewhere in the instant specification.

The source/drain region 130 may be interposed between the circuit active fins 105 and the circuit contact structure CA. The source/drain region 130 may be configured to be a source region or a drain region of the transistor. The source/drain region 130 may be implemented on an area after recessing a portion of upper portions of the circuit active fins 105. However, the operation of recessing the portion might or might not be performed and a depth of the recess may be variously changed. The source/drain regions 130 may be a semiconductor layer including silicon (Si), and may include an epitaxial layer. The source/drain regions 130 may include impurities having different conductivity types and/or different concentrations. For example, the source/drain regions 130 may include n-type doped silicon (Si) and/or p-type doped silicon germanium (SiGe). In an exemplary embodiment of the inventive concept, the source/drain regions 130 may include a plurality of regions including elements and/or doping elements having different concentrations.

The gate structure 140 may be disposed to extend in one direction, for example, the Y direction across the circuit active fins 105 above the circuit active fins 105. A channel region of transistors may be formed in the circuit active fins 105 intersecting the gate structure 140. The gate structure 140 includes a gate electrode 145, a gate dielectric layer 142 between the gate electrode 145 and the circuit active fins 105, a gate spacer layer 144 on side surfaces of the gate electrode 145, and a gate capping layer 146 on the gate electrode 145.

The gate dielectric layer 142 may be disposed between the circuit active fins 105 and the gate electrode 145. The gate dielectric layer 142 may be disposed to surround one or more surfaces of the gate electrode 145. In one embodiment, the gate dielectric layer 142 might not surround an uppermost surface of the gate electrode 145. The gate dielectric layer 142 may include an oxide, a nitride, or a high-k dielectric material.

The gate electrode 145 may be disposed to extend over the circuit active fins 105 across the circuit active fins 105. The gate electrode 145 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The gate electrode 145 may have a multilayer structure including two or more layers.

The gate spacer layer 144 may be disposed on both side surfaces of the gate electrode 145 and may extend in the Z direction, perpendicular to an upper surface of the substrate 101. According to an exemplary embodiment of the inventive concept, the gate spacer layer 144 may have a multilayer structure. The gate spacer layer 144 may be formed of an oxide, a nitride, and an oxynitride, in particular, a low-k dielectric material.

The gate capping layer 146 may be disposed on the gate electrode 145. The gate capping layer 146 may be disposed to extend along an upper surface of the gate electrode 145 in a second direction, for example, the Y direction. The gate capping layer 146 may be formed of an oxide, a nitride, and an oxynitride.

The integrated circuit structure 100 of the semiconductor device 10 may include a first interlayer insulating layer 181 on the substrate 101, a circuit contact structure CA penetrating through the first interlayer insulating layer 181 and disposed on the source/drain regions 130, a gate contact structure CB electrically connected to the gate electrode 145 through the first interlayer insulating layer 181, a second interlayer insulating layer 182 on the first interlayer insulating layer 181, a circuit interconnection structure CM1a connected to the circuit contact structure CA through the second interlayer insulating layer 182, and a gate interconnection structure CM1b penetrating through the second interlayer insulating layer 182 and disposed on the gate contact structure CB.

The circuit contact structure CA may be electrically connected to the source/drain regions 130 through the first interlayer insulating layer 181 and may apply an electrical signal to the source/drain regions 130. The circuit contact structure CA may be disposed on the source/drain regions 130, as illustrated in FIG. 4. According to an exemplary embodiment, the circuit contact structure CA may be disposed to have a greater length than the source/drain regions 130 in the Y direction. The circuit contact structure CA may have an inclined side surface in which a width of a lower portion is narrower than a width of an upper portion according to an aspect ratio, but the present disclosure is not limited thereto. In an exemplary embodiment, the circuit contact structure CA may recess upper portions of the source/drain regions 130. The circuit contact structure CA may be disposed to be in contact with the source/drain regions 130 along upper surfaces of the source/drain regions 130 without recessing the source/drain regions 130.

The circuit contact structure CA may include a metal-semiconductor compound layer 152a, a barrier layer 154a, and a contact plug 155a. The barrier layer 154a may surround the contact plug 155a. The barrier layer 154a may cover a side surface and a lower surface of the contact plug 155a. The metal-semiconductor compound layer 152a may be disposed between the barrier layer 154a and the source/drain regions 130.

The metal-semiconductor compound layer 152a may include metal silicide, metal germanide, or metal silicide-germanide. The metal may be Ti, Ni, Ta, Co, or W, and the semiconductor may be Si, Ge or SiGe. The barrier layer 154a may be formed of a metal nitride such as titanium nitride (TiN), tantalum nitride (TaN), or tungsten nitride (WN). The contact plug 155a may be formed of, for example, tungsten (W), cobalt (Co), titanium (Ti), an alloy thereof, or a combination thereof.

The gate contact structure CB may be electrically connected to the gate electrode 145 through the second interlayer insulating layer 182 and the gate capping layer 146, and may apply an electrical signal to the gate electrode 145. The gate contact structure CB may be disposed on the gate electrode 145, as illustrated in FIG. 5C. The gate contact structure CB may have an inclined side surface in which a width of a lower portion is narrower than a width of an upper portion according to an aspect ratio, but the present disclosure is not limited thereto. In an exemplary embodiment, the gate contact structure CB may recess the upper portion of the gate electrode 145.

The gate contact structure CB may include a gate barrier layer 154b and a gate contact plug 155b. The gate barrier layer 154b may surround the gate contact plug 155b. The gate barrier layer 154b may cover a side surface and a lower surface of the gate contact plug 155b.

The gate barrier layer 154b may be formed of a metal nitride such as titanium nitride (TiN), tantalum nitride (TaN), or tungsten nitride (WN). The gate contact plug 155b may be formed of, for example, tungsten (W), cobalt (Co), titanium (Ti), an alloy thereof, or a combination thereof.

In an exemplary embodiment of the inventive concept, a lower surface of the gate contact plug 155b may be higher than a lower surface of the contact plug 155a. An upper surface of the gate contact plug 155b may be substantially coplanar with an upper surface of the second interlayer insulating layer 182 and/or an upper surface of the contact plug 155a.

The circuit interconnection structure CM1a may be connected to the circuit contact structure CA through the second interlayer insulating layer 182. The circuit interconnection structure CM1a may have an inclined side surface in which a width of a lower portion is narrower than a width of an upper portion according to an aspect ratio, but the present disclosure is not limited thereto.

The circuit interconnection structure CM1a may include a metal barrier layer 164a and a metal interconnection layer 165a. The metal barrier layer 164a may surround the metal interconnection layer 165a. The metal barrier layer 164a may cover a side surface and a lower surface of the metal interconnection layer 165a.

The metal barrier layer 164a may be formed of a metal nitride such as titanium nitride (TiN), tantalum nitride (TaN), or tungsten nitride (WN). The metal interconnection layer 165a may be formed of, for example, tungsten (W), cobalt (Co), titanium (Ti), an alloy thereof, or a combination thereof.

The gate interconnection structure CM1b may be connected to the gate contact structure CB through the second interlayer insulating layer 182. The gate interconnection structure CM1b may have an inclined side surface in which a width of a lower portion is narrower than a width of an upper portion according to an aspect ratio, but the present disclosure is not limited thereto.

The gate interconnection structure CM1b may include a gate conductive barrier layer 164b and a gate conductive interconnection layer 165b. The gate conductive barrier layer 164b may surround the gate conductive interconnection layer 165b. The gate conductive barrier layer 164b may cover a side surface and a lower surface of the gate conductive interconnection layer 165b.

The gate conductive barrier layer 164b may be formed of a metal nitride such as titanium nitride (TiN), tantalum nitride (TaN), or tungsten nitride (WN). The gate conductive interconnection layer 165b may be formed of, for example, tungsten (W), cobalt (Co), titanium (Ti), an alloy thereof, or a combination thereof.

The integrated circuit structure 100 of the semiconductor device 10 may further include a body contact structure applying a body bias to the substrate 101 in the first region R1. The body contact structure may be indirect contact with at least a portion of the circuit active fins 105.

The integrated circuit structure 100 of the semiconductor device 10 may include a third interlayer insulating layer 183 on the second interlayer insulating layer 182, first and second circuit region vias 171 and 172, respectively connected to the circuit contact structure CA and the gate contact structure CB through the third interlayer insulating layer 183, and first and second circuit region conductive lines 191 and 192, respectively connected to the first and second circuit region vias 171 and 172.

The first to fourth interlayer insulating layers 181, 182, 183, and 184 may be sequentially stacked on the substrate 101. At least one of the first to fourth interlayer insulating layers 181, 182, 183, and 184 includes, for example, tetraethyl orthosilicate (TEOS), undoped silicate glass (USG), phosphosilicate glass (PSG), and borosilicate glass (BSG), boron phosphosilicate glass (BPSG), fluoride silicate glass (FSG), spin on glass (SOG), tonen silazene (TOSZ), or a combination thereof.

The first and second circuit region vias 171 and 172 may be in contact with an upper portion of the metal interconnection layer 165a and an upper portion of the gate conductive interconnection layer 165b through the third interlayer insulating layer 183. The first and second circuit region vias 171 and 172 may include copper or an alloy containing copper.

The first and second circuit region conductive lines 191 and 192 may be in contact with an upper portion of the first circuit region via 171 and an upper portion of the second circuit region via 172 through the fourth interlayer insulating layer 184. The first and second circuit region conductive lines 191 and 192 may include copper or an alloy containing copper.

Figure 5D:
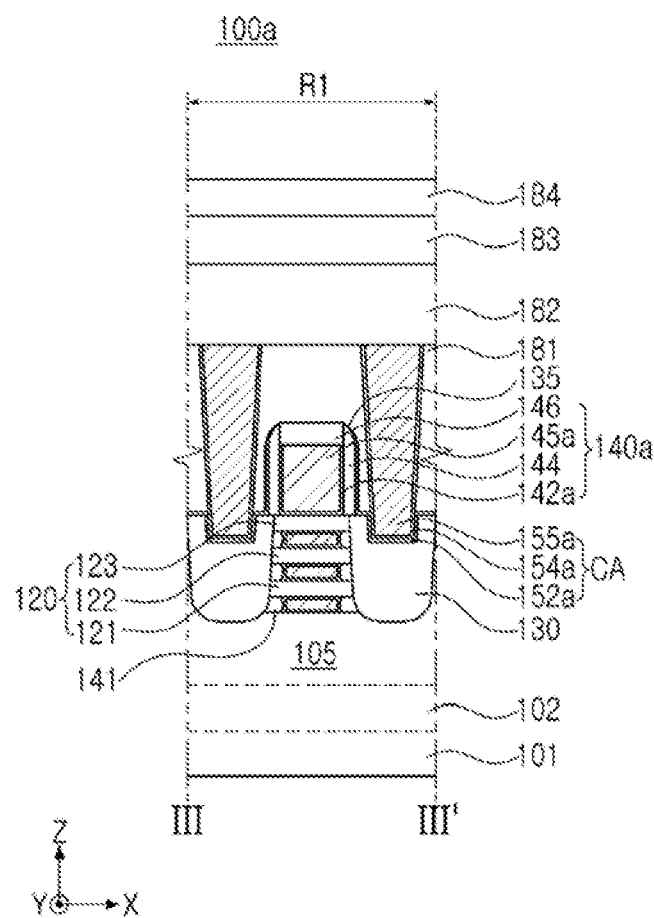

FIG. 5D is a cross-sectional view of a semiconductor device according to an exemplary embodiment of the inventive concept. FIG. 5D is a cross-sectional view of the semiconductor device taken along line III-III' in FIG. 4.

Referring to FIG. 5D, an integrated circuit structure 100a of the semiconductor device 10 may further include a channel structure 120 including a plurality of channel layers 121, 122, and 123 disposed on the circuit active fins 105 to be vertically spaced apart from each other. A gate electrode 145a may be disposed between the circuit active fins 105 and the channel structure 120, between the plurality of channel layers 121, 122, 123 of the channel structure 120, and on the channel structure 120. Accordingly, the semiconductor device 100a may include a channel structure 120, source/drain regions 130, and a multi-bridge channel FET (MBCFET™) formed by a gate structure 140a.

The gate structure 140a includes the gate electrode 145a, a gate dielectric layer 142a, the gate spacer layer 144 on side surfaces of the gate electrode 145a, and the gate capping layer 146 on the gate electrode 145a.

The gate dielectric layer 142a may be disposed between the circuit active fins 105 and the gate electrode 145a. The gate dielectric layer 142a may be disposed to surround one or more surfaces of the gate electrode 145a. In one embodiment, the gate dielectric layer 142a might not surround an uppermost surface of the gate electrode 145a. The gate dielectric layer 142a may include an oxide, a nitride, or a high-k dielectric material.

In the integrated circuit structure 100a of the semiconductor device 10, the gate structure 140a may further include internal spacer layers 141. The internal spacer layers 141 may be disposed parallel to the gate electrode 145a between the channel structures 120. The internal spacer layers 141 may be disposed on both sides of the gate structure 140a in an X direction on a lower surface of each of the first to third channel layers 121, 122, and 123. The internal spacer layers 141 may have external side surfaces substantially coplanar with external side surfaces of the first to third channel layers 121, 122, and 123. The gate electrode 145a may be spaced apart from the source/drain regions 130 by internal spacer layers 141 below the third channel layer 123 to be electrically separated from the source/drain regions 130. The internal spacer layers 141 may be formed of an oxide, a nitride, and an oxynitride, in particular, a low-k dielectric material.

Figure 6A:
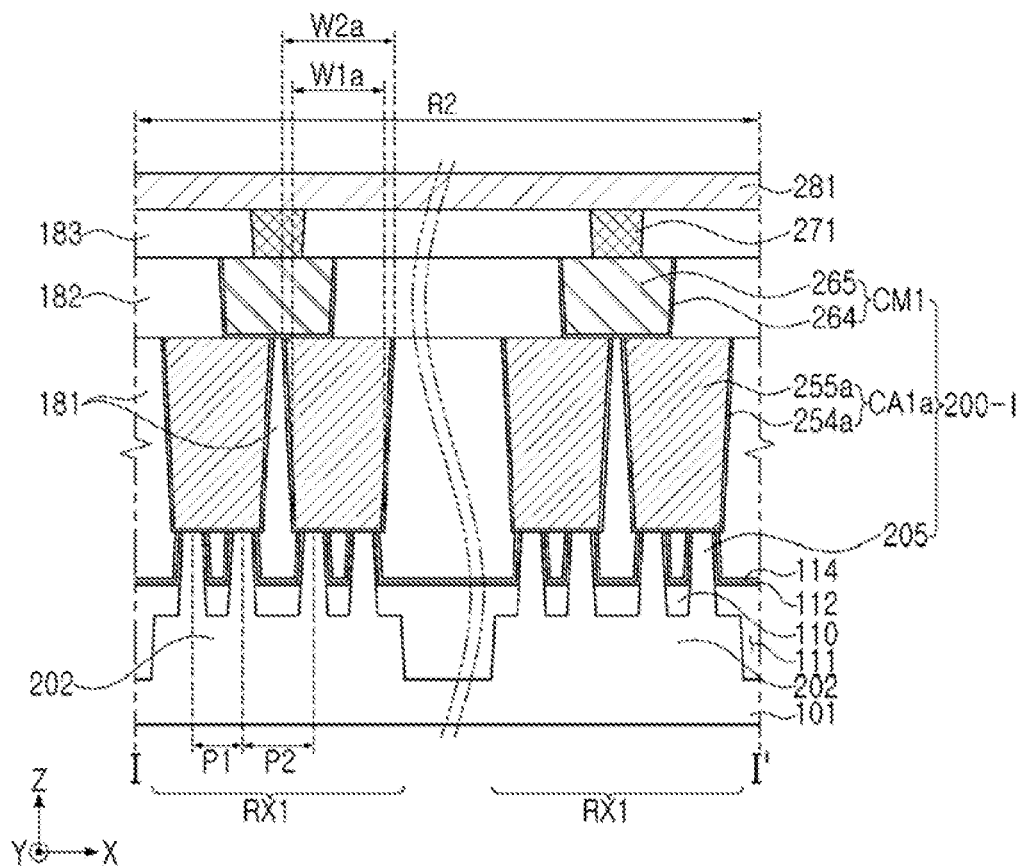
FIGS. 6A to 6F are cross-sectional views illustrating guard ring of a semiconductor device according to some exemplary embodiments of the inventive concept.

FIG. 6A is a cross-sectional view illustrating a guard ring of a semiconductor device according to an exemplary embodiment of the inventive concept. FIG. 6A illustrates a region corresponding to a cross section of the guard ring of the semiconductor device in FIG. 2A, taken along line I-I' in FIG. 2A.

Referring to FIG. 6A, a pair of first guard contact structures CA1a of a first guard ring 200-1 may be in contact with all of first guard active fins 205 of a first guard active structure RX1. For example, the pair of first guard contact structures CA1a may be spaced apart from each other in the X direction and each of the pair of first guard contact structures CA1a may be in contact with two adjacent first guard active fins 205 and other two adjacent first guard active fins 205 in the first guard active structure RX1, respectively.

A width of a lower end of the first guard contact structure CA1a in the X direction may be referred to as a first width W1a. A width of an upper end of the first guard contact structure CA1a in the X direction may be referred to as a second width W2a. The second width W2a may be greater than the first width W1a. According to an embodiment of the inventive concept, the first width W1a may be greater than a width of each of the first guard active fins 205. According to an embodiment of the inventive concept, a width of each of the first guard contact structures CA1a may be greater than a width of each of the circuit active fins 105.

In an embodiment of the inventive concept, a width of a lower end of the first guard contact structure CA1a in the X direction (i.e., the first width W1a) may be greater than the first pitch P1 and the second pitch P2 described with reference to FIG. 3A.

In an embodiment of the inventive concept, the first guard contact structure CA1a may include a first guard barrier layer 254a and a first guard contact plug 255a. The first guard barrier layer 254a may surround the first guard contact plug 255a. The first guard barrier layer 254a may cover a side surface and a lower surface of the first guard contact plug 255a. The first guard barrier layer 254a may be disposed between the first guard active fins 205 and the first guard contact plug 255a.

The first guard barrier layer 254a may be formed of a metal nitride such as titanium nitride (TiN), tantalum nitride (TaN), or tungsten nitride (WN). The first guard contact plug 255a may be formed of, for example, tungsten (W), cobalt (Co), titanium (Ti), an alloy thereof, or a combination thereof.

Figure 6B:
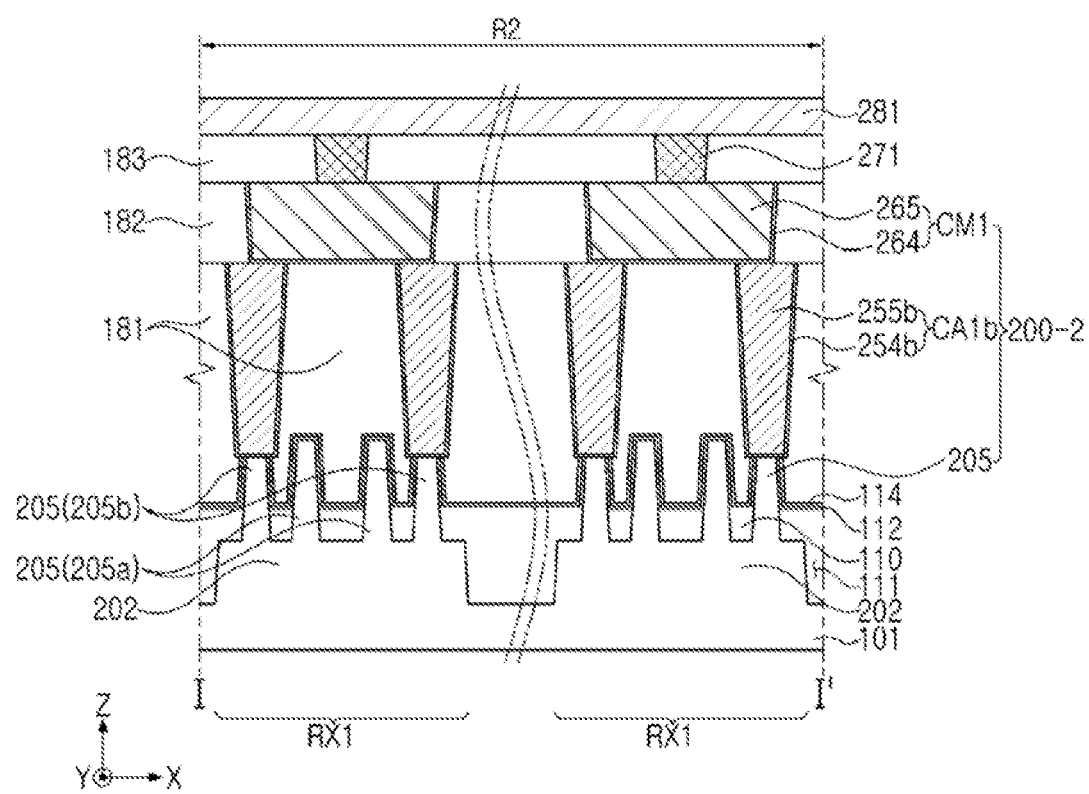

FIG. 6B is a cross-sectional view illustrating a guard ring of a semiconductor device according to an exemplary embodiment of the inventive concept. FIG. 6B illustrates a region corresponding to a cross section of the guard ring of the semiconductor device in FIG. 2A, taken along line I-I' in FIG. 2A.

Referring to FIG. 6B, a pair of first guard contact structures CA1b of a first guard ring 200-2 may be spaced apart from each other and each of the pair of first guard contact structures CA1b may be in contact with first external active fins 205b of a first guard active structure RX1, respectively. In this embodiment of the inventive concept, each of the pair of first guard contact structures CA1b might not be in contact with first internal active fins 205a, but the present disclosure is not limited thereto. In another embodiment, each of the pair of first guard contact structures CA1b may be in contact with at least a portion of the first internal active fins 205a.

In an embodiment of the inventive concept, the first guard contact structure CA1b may include a first guard barrier layer 254b and a first guard contact plug 255b. The first guard barrier layer 254b may surround the first guard contact plug 255b. The first guard barrier layer 254b may cover a side surface and a lower surface of the first guard contact plug 255b. The first guard barrier layer 254b may be disposed between the first guard active fins 205 and the first guard contact plug 255b.

The first guard barrier layer 254b may be formed of a metal nitride such as titanium nitride (TiN), tantalum nitride (TaN), or tungsten nitride (WN). The first guard contact plug 255b may be formed of, for example, tungsten (W), cobalt (Co), titanium (Ti), an alloy thereof, or a combination thereof.

Figure 6C:
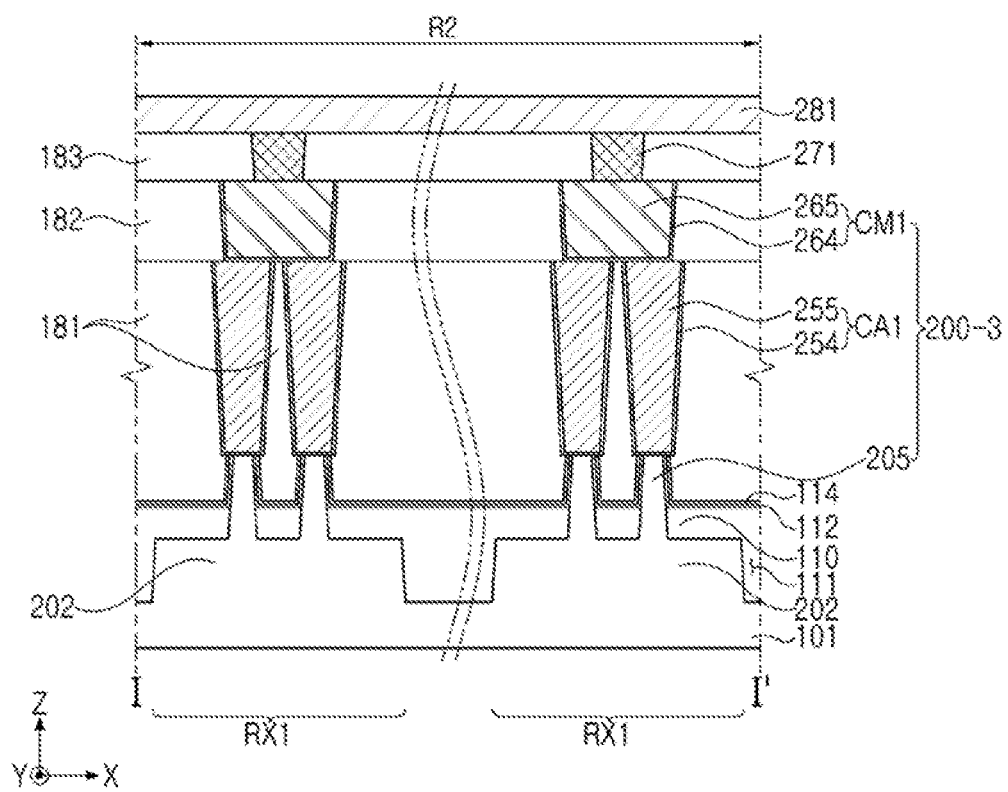

FIG. 6C is a cross-sectional view illustrating a guard ring of a semiconductor device according to an exemplary embodiment of the inventive concept. FIG. 6C illustrates a region corresponding to a cross section of the guard ring of the semiconductor device in FIG. 2A, taken along line I-I' in FIG. 2A.

Referring to FIG. 6C, a first guard active structure RX1 of the first guard ring 200-3 may include two first guard active fins 205. A pair of first guard contact structures CA1 may be spaced apart from each other in the X direction, and each of the pair of first guard contact structures CA1 may be in contact with the two first guard active fins 205, respectively.

Figure 6D:
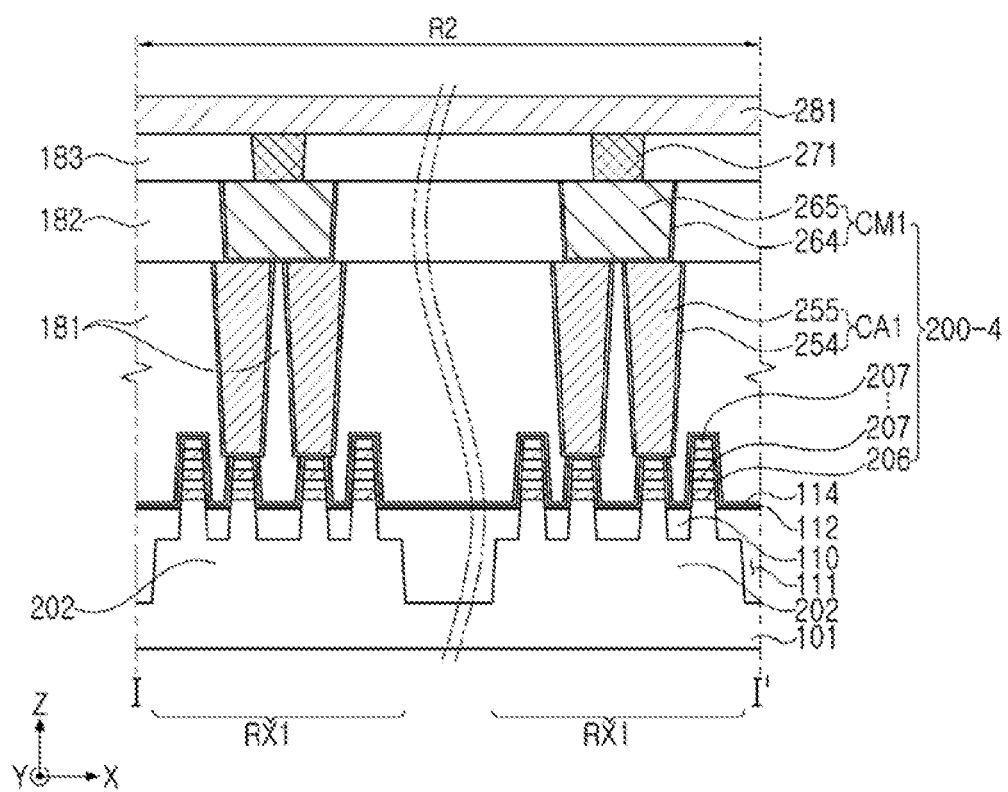

FIG. 6D is a cross-sectional view illustrating a guard ring of a semiconductor device according to an exemplary embodiment of the inventive concept. FIG. 6D illustrates a region corresponding to a cross section of the guard ring of the semiconductor device in FIG. 2A, taken along line I-I' in FIG. 2A.

Referring to FIG. 6D, first guard active fins 205 of a first guard ring 200-4 may include a semiconductor stacked structure in which a first semiconductor layer 206 and a second semiconductor layer 207 are repeatedly stacked. A first guard contact structure CA1 may be in contact with the semiconductor stacked structure by recessing a portion of an upper portion of the semiconductor stacked structure. For example, the first semiconductor layer 206 may include silicon-germanium (SiGe), and the second semiconductor layer 207 may include silicon (Si).

This embodiment of the inventive concept may be implemented during manufacturing of the semiconductor device 100a corresponding to the MBCFET™ described with reference to FIG. 5D. For example, second semiconductor layers 207 may be formed in the same process as respective channel layers 121, 122, and 123 in FIG. 5D. First semiconductor layers 206 may be formed in a same or substantially similar process as respective sacrificial layers substituted by gate electrodes 145a between channel layers 121, 122, and 123 in FIG. 5D.

Figure 6E:
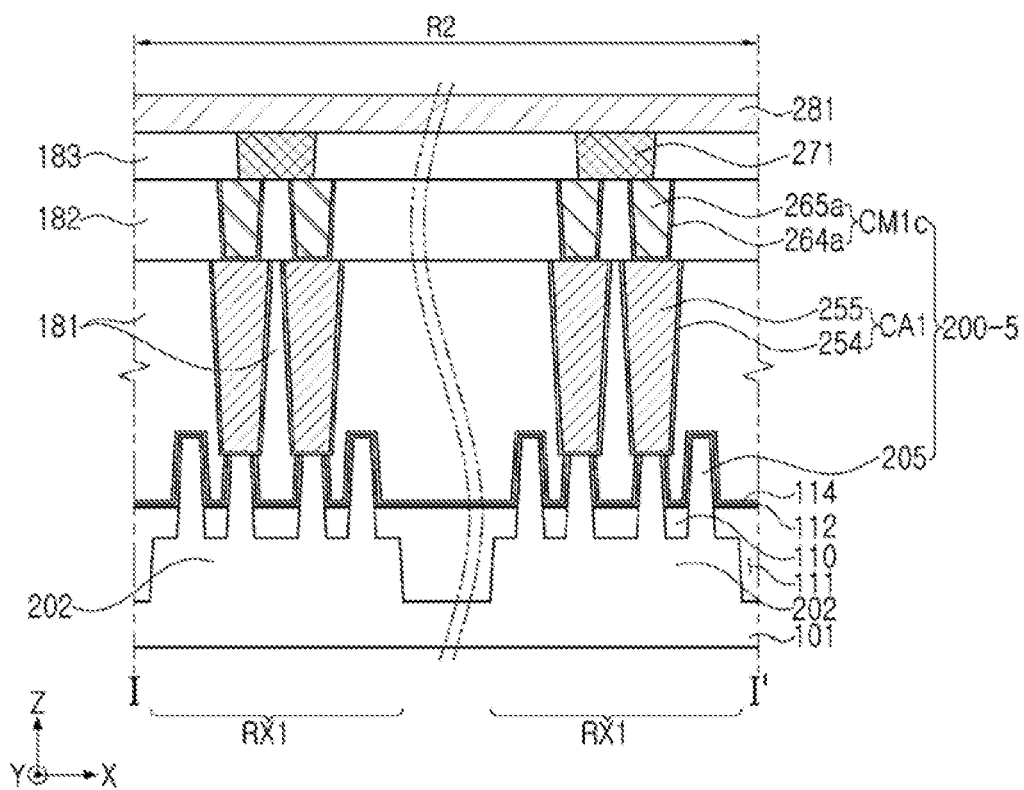

FIG. 6E is a cross-sectional view illustrating a guard ring of a semiconductor device according to an exemplary embodiment of the inventive concept. FIG. 6E illustrates a region corresponding to a cross section of the guard ring of the semiconductor device in FIG. 2A, taken along line I-I' in FIG. 2A.

Referring to FIG. 6E, a pair of first guard interconnection structures CM1c of a first guard ring 200-5 may be in contact with a pair of first guard contact structures CA1, respectively. The pair of first guard interconnection structures CM1c may be spaced apart from each other in the X direction to be connected to the pair of first guard contact structures CA1. The pair of first guard contact structures CA1 and the pair of first guard interconnection structures CM1c may be connected through the first vias 271, respectively.

The first guard interconnection structure CM1c may include a first conductive barrier layer 264a and a first guard interconnection layer 265a. The first conductive barrier layer 264a may surround the first guard interconnection layer 265a. According to an embodiment of the inventive concept, the first conductive barrier layer 264a may surround a side surface and a lower surface of the first guard interconnection layer 265a.

The first conductive barrier layer 264a may be formed of a metal nitride such as titanium nitride (TiN), tantalum nitride (TaN), or tungsten nitride (WN). The first guard interconnection layer 265a may be formed of, for example, tungsten (W), cobalt (Co), titanium (Ti), an alloy thereof, or a combination thereof.

Figure 6F:
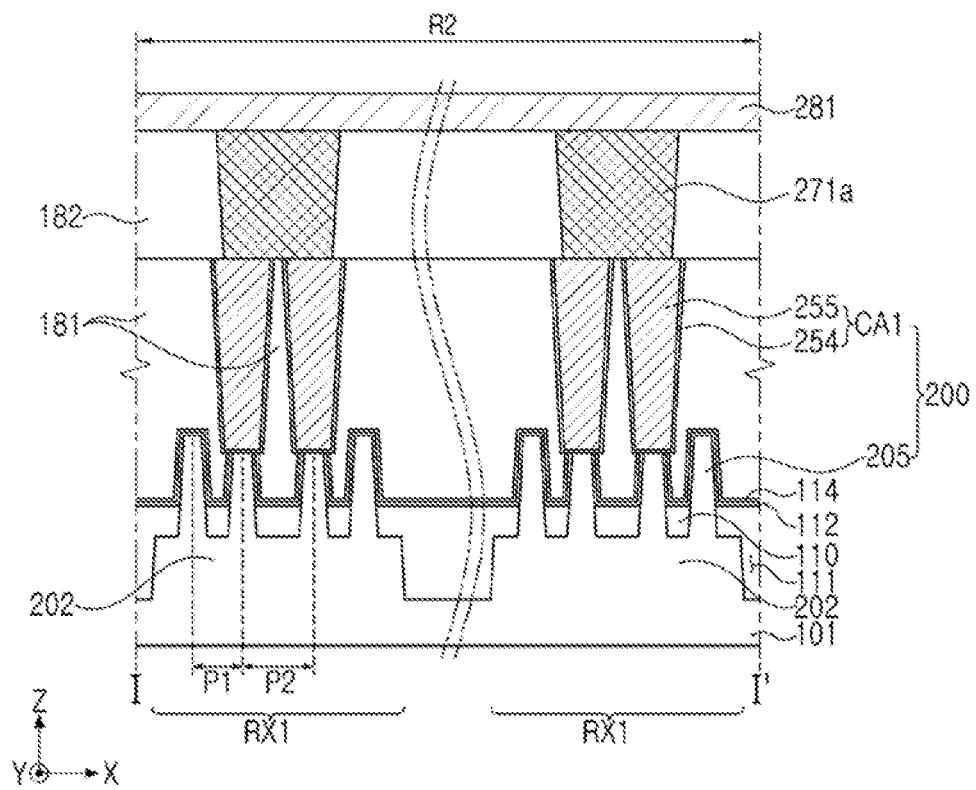

FIG. 6F is a cross-sectional view illustrating a guard ring of a semiconductor device according to an exemplary embodiment of the inventive concept. FIG. 6F illustrates a region corresponding to a cross section of the guard ring of the semiconductor device in FIG. 2A, taken along line I-I' in FIG. 2A.

Referring to FIG. 6F, a first guard interconnection structure CM1 may be excluded in a second region R2. The first via 271a may connect a pair of first guard contact structures CA1 to each other through a second interlayer insulating layer 182. A first interlayer insulating layer 181 may be disposed between the pair of first guard contact structures CA1 below a first via 271a. In this case, at least a portion of the first interlayer insulating layer 181 may be in direct contact with a lower portion of the first via 271a.

The descriptions provided above with reference to FIGS. 6A to 6F may be equivalently applied to the second guard ring 300 in the third region R3, unless otherwise specified. Elements of the second guard ring 300 will be designated by the same or similar reference numerals as shown in FIGS. 6A to 6F, respectively, or to the extend that a description of an element has been omitted, it may be assumed that the description is at least similar to that of corresponding elements that have been described elsewhere in the instant specification FIG. 7A is an enlarged view of a guard ring of a semiconductor device according to an exemplary embodiment of the inventive concept. FIG. 7A illustrates a region corresponding to region 'A' in FIG. 1.

Referring to FIG. 7A, a first guard ring 200a may have a shape in which rectangular regions are repeatedly disposed adjacent to each other, in a plan view. The first guard ring 200a may include a first guard ring external pattern 200aa, extending from both sides of the second region R2 in the Y direction and having an uneven shape, and a first guard ring internal pattern 200ab surrounded by the first guard ring external pattern 200aa and having a rectangular shape. A first interlayer insulating layer 181 may be disposed in a rectangular region formed by the first guard ring internal pattern 200ab. A first guard active structure RX1' and a first guard contact structure CA1', constituting the first guard ring 200a, may also have the same planar shape as described above.

FIG. 7A illustrates an exemplary shape of a first guard ring 200a. The shape of the first guard ring 200a may vary depending on an area in which the first guard ring is disposed, the number of first guard active structures RX', and the like.

FIG. 7B is a partially enlarged view of a guard ring of a semiconductor device according to an exemplary embodiment of the inventive concept. FIG. 7B illustrates a region corresponding to region 'B' in FIG. 1.

Referring to FIG. 7B, second guard rings 300aa and 300ab may each have an uneven shape, in a plan view. Each of the second guard rings 300aa and 300ab may include a concave portion and a convex portion, when in a plan view. The second guard rings 300aa and 300ab may extend at regular intervals in the Y direction, bent from at least one point in the X direction, and bent again in the Y direction. Second guard active fins 305', second guard contact structure CA2', and third guard contact structure CA3', included in the second guard rings 300aa and 300ab, may also have the same planar shape as described above. The second guard ring 300aa may include a plurality of second guard rings and, based on the same direction, a concave portion and a convex portion formed in one second guard ring 300aa may be disposed to oppose a convex portion and a concave portion of another second guard ring 300ab adjacent thereto, respectively.

A portion of the second guard rings 300aa and 300ab may include a second guard contact structure CA2', and other portion of the second guard rings 300aa and 300ab may include a third guard contact structure CA3'.

FIG. 7C is a partially enlarged view of a guard ring of a semiconductor device according to an exemplary embodiment of the inventive concept. FIG. 7C illustrates a region corresponding to region 'B' in FIG. 1.

Referring to FIG. 7C, unlike the second guard rings 300aa and 300ab in FIG. 7B, second guard rings 300aa and 300ab may each include a plurality of second guard rings and, based on the same direction, a concave portion and a convex portion formed in one second guard ring 300aa may be disposed to oppose a concave portion and a convex portion formed in another second guard ring 300ab adjacent thereto, respectively.

Due to the uneven shapes of the second guard rings 300aa and 300ab, overall length of the second guard rings 300aa and 300ab may be increased and moisture may be prevented from permeating a semiconductor device in a dicing process.

Figure 8A:
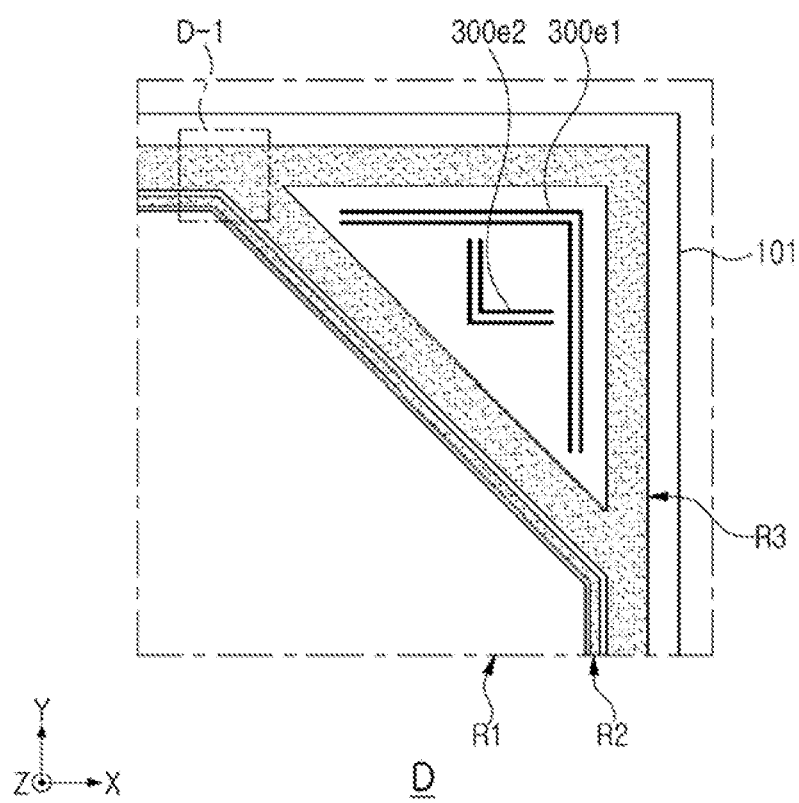
FIGS. 8A to 8C are partially enlarged views illustrating edge portions of guard ring of a semiconductor device according to some exemplary embodiments of the inventive concept.
Figure 8B:
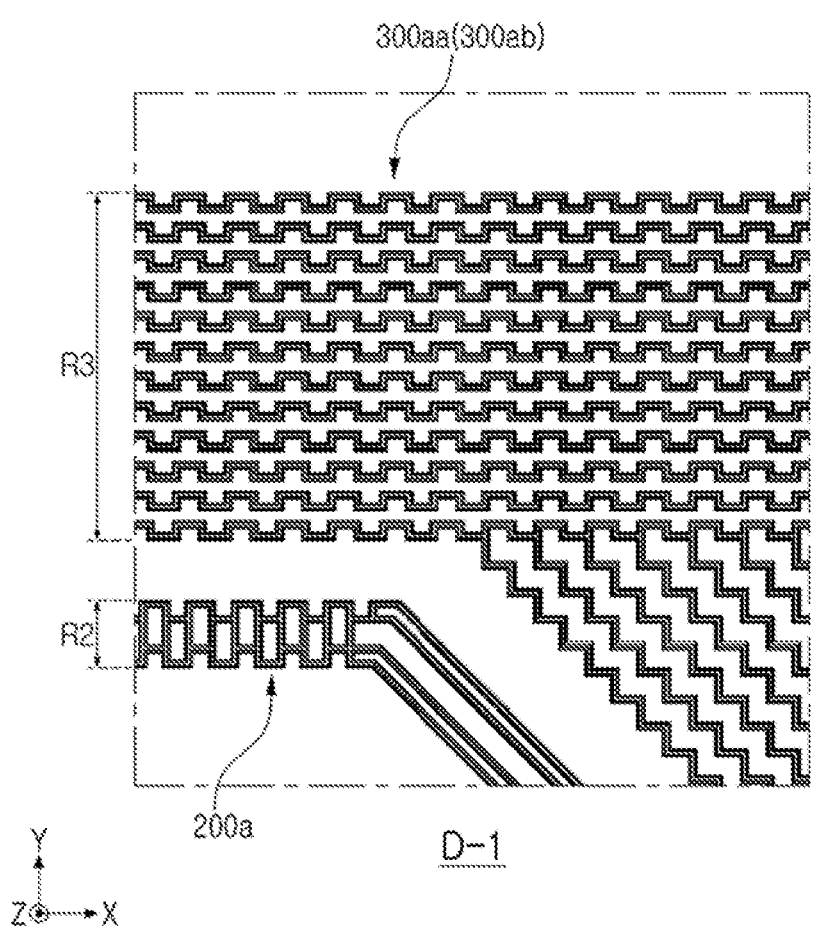
Figure 8C:
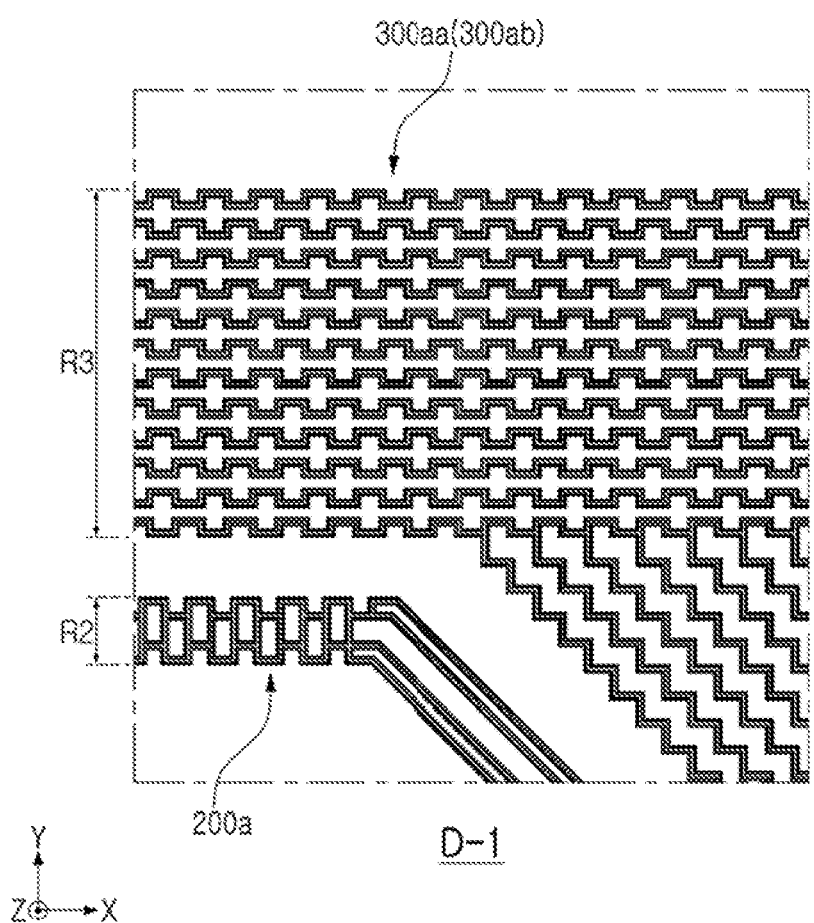

Hereinafter, a corner portion of a guard ring of a semiconductor device will be described with reference to FIGS. 8A to 8C according to some exemplary embodiments of the inventive concept. FIG. 8A is a partially enlarged view of a region corresponding to region 'D' in FIG. 1. FIG. 8B is a partially enlarged view of a region corresponding to region 'D-1' in FIG. 8A. FIG. 8C is a partially enlarged view of a region corresponding to region 'D-1' in FIG. 8A.

In FIG. 1, a corner portion of the guard ring of the semiconductor device 10 is illustrated as not including a curved or bent portion. However, referring to FIGS. 8A to 8C, a second region R2 and a third region R3 may each include a curved or bent portion in a corner region of the semiconductor device 10.

A first region R1 may have an octagonal shape, in a plan view. A second region R2 may have a structure curved or bent in the corner region of the semiconductor device 10 while surrounding the first region R1. A third region R3 may also have a structure curved or bent in the corner region of the semiconductor device 10 while surrounding the second region R2. The first guard ring 200a may have a portion extending with a repeated pattern on the second region R2 and linearly extending in the corner region of the semiconductor device 10. The first guard ring 200a may surround a corner portion of the first region R1 in a curved form. The second guard rings 300aa and 300ab may surround a corner portion of the second region R2 in a curved form. The second guard rings 300aa and 300ab may also include a portion extending with a repeated pattern on the third region R3 and bent in the corner region of the semiconductor device 10 in a zigzag manner.

The second guard rings 300aa and 300ab of the third region R3 may have a triangular shape in the corner region of the semiconductor device 10. Second edge guard rings 300e1 and 300e2 may be further disposed in the triangular shape. The second edge guard rings 300e1 and 300e2 may be disposed to be spaced apart from the first guard ring 200a in the second region R2 and the second guard rings 300aa and 300ab in the third region R3. The second edge guard rings 300e1 and 300e2 may have the same vertical cross section as the second guard rings 300aa and 300ab. Each of the second edge guard rings 300e1 and 300e2 may have a shape of a line extending in at least one direction within the triangular shape, and may also have an uneven shape. The second edge guard rings 300e1 and 300e2 may be provided to protect an integrated circuit structure in an edge region of a semiconductor device vulnerable to moisture permeation or cracking during a dicing process of the semiconductor device.

FIGS. 9A to 15B are process flow diagrams illustrating a method of manufacturing a semiconductor device according to some exemplary embodiments of the inventive concept. In FIGS. 9A to 15B, a method of manufacturing the semiconductor device (referring to FIGS. 2A to 3B) will be described herein.

Figure 9A:
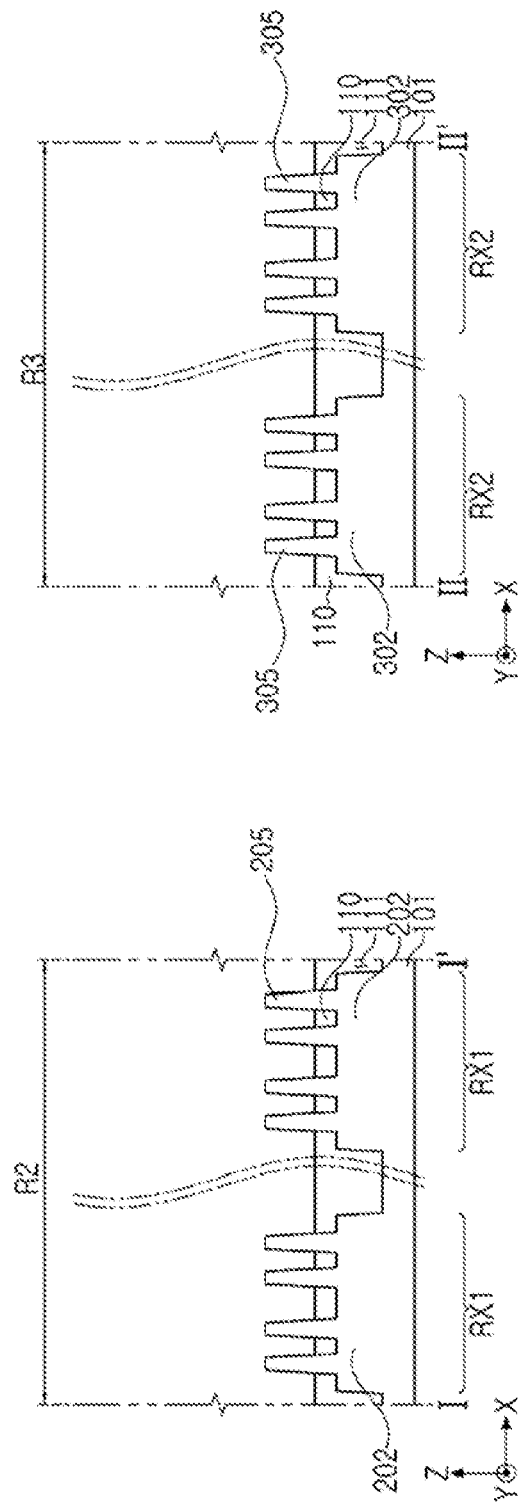
FIGS. 9A to 15B are process flow diagrams illustrating a method of manufacturing a semiconductor device according to some exemplary embodiments of the inventive concept.
Figure 9B:
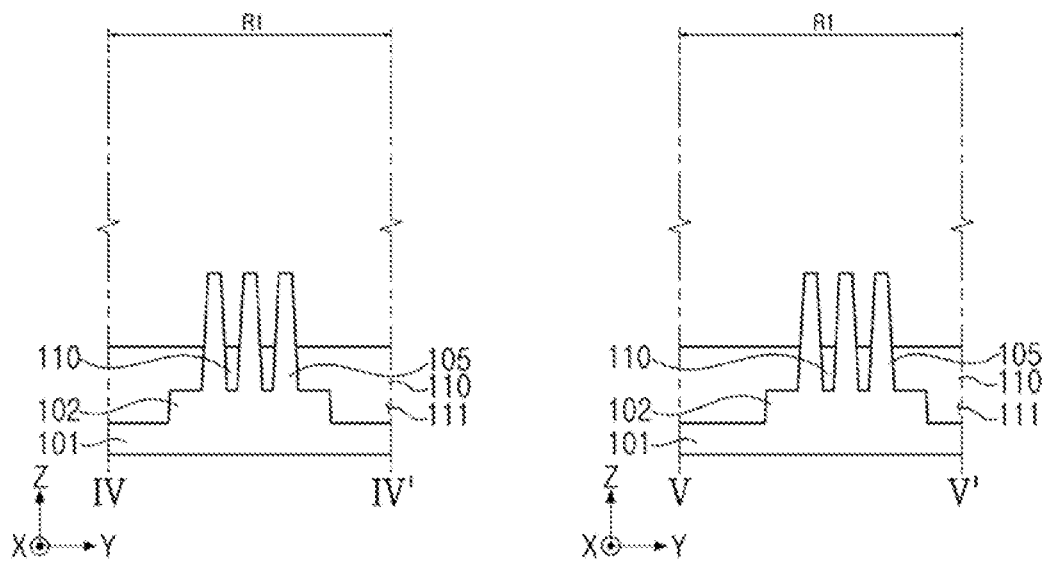

Referring to FIGS. 9A and 9B, a plurality of active fins may be formed on a substrate 101.

Active fins 105 may be provided in a first region R1 of the substrate 101 by a isolation region 110. First guard active fins 205 may be provided in a second region R2 of the substrate 101 by the isolation region 110. The active fins 105 may be formed on the active regions 102. The active regions 102 may be defined by the deep isolation region 111. Second guard active fins 305 may be provided in a third region R3 of the substrate 101 by the isolation region 110. The active fins 105 and the first and second guard active fins 205 and 305 may have a structure protruding from the substrate 101.

In another exemplary embodiment of the inventive concept, a plurality of sacrificial layers and a plurality of channel layers 121, 122, and 123 may be alternately stacked on the substrate 101. Sacrificial layers may be replaced with a gate dielectric layer 142 and a gate electrode 145 through a subsequent process. The sacrificial layers may be formed of a material having an etching selectivity with respect to the channel layers 121, 122, and 123. For example, the sacrificial layers may include silicon germanium (SiGe), and the channel layers 121, 122, and 123 may include silicon (Si).

Figure 10A:
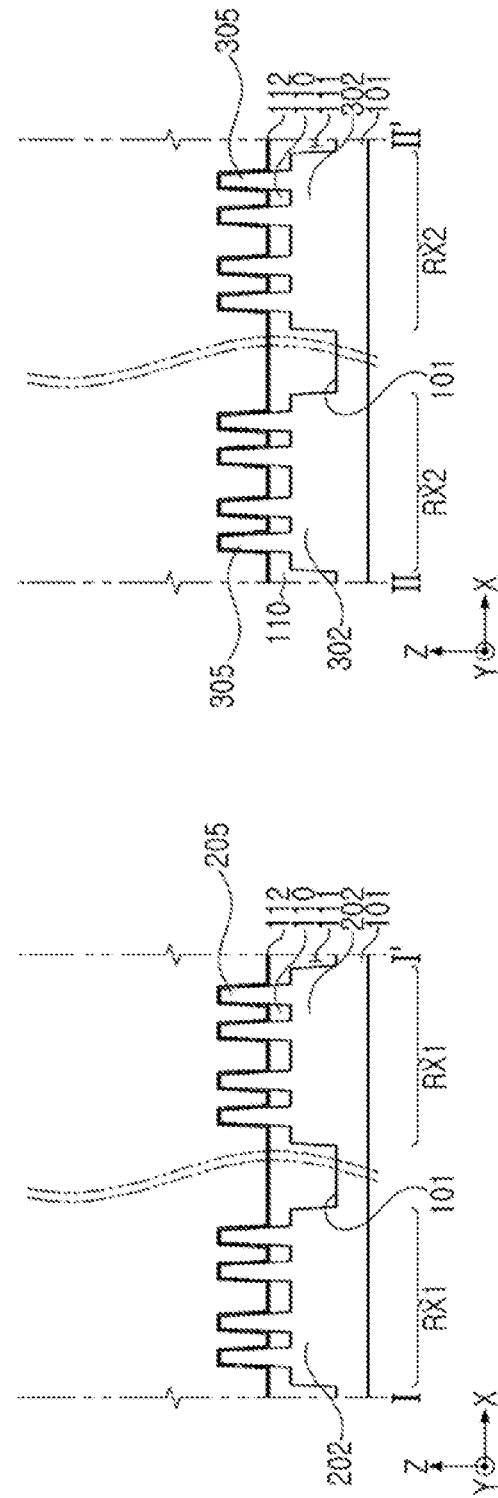
Figure 10B:
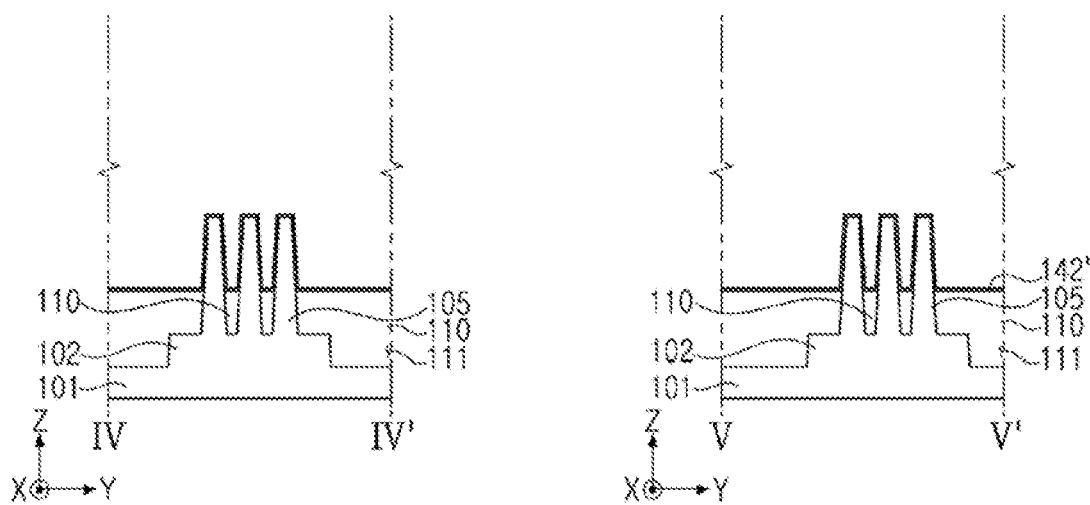

Referring to FIGS. 10A and 10B, a first protective layer 112 may be formed to cover the active fins 105, the first and second guard active fins 205 and 305, and the isolation region 110.

The first protective layer 112 may conformally cover the active fins 105, the first and second guard active fins 205, and 305. The first protective layer 112 may be formed over the entire region of the first to third regions R1, R2, and R3 of the substrate 101, or formed in only a portion of the regions R1, R2, and R3, for example, the second and third region R2 and R3. A first protective layer 112 formed in the first region R1 may be patterned by a gate electrode mask pattern layer 146' in a process (described below) to remain as a sacrificial gate dielectric layer 142'. The first protective layer 112 may include, for example, an oxide, a nitride, or a combination thereof.

The first protective layer 112 may protect the first guard active fins 205 and the second guard active fins 305 of the second region R2 and the third region R3 during a process of forming source/drain regions 130 and a gate structure 140 (will be described later).

Figure 11A:
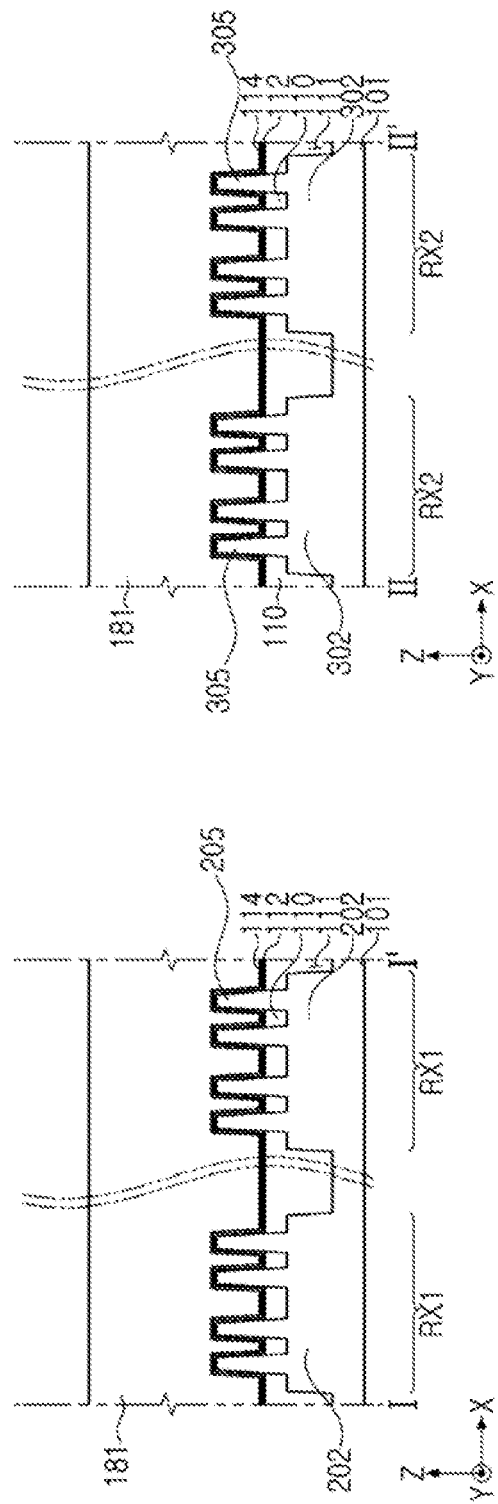
Figure 11B:
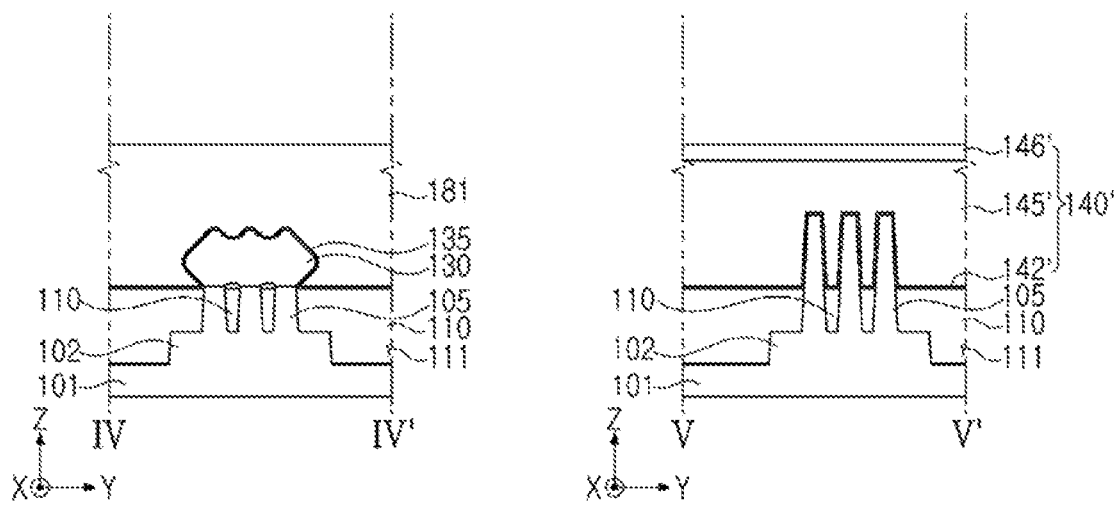

Referring to FIGS. 11A and 11B, a sacrificial gate structure 140' may be formed across the active fins 105. Source/drain regions 130 may be formed on the active fins 105 by removing a portion of the active fins 105 and performing a selective epitaxial growth (SEG) process. An etch-stop layer 135 may be formed to cover the source/drain regions 130. A first interlayer insulating layer 181 may be formed between sacrificial gate structures 140' and on the source/drain regions 130.

In the first region R1, a sacrificial gate structure 140' may be formed to extend in one direction across the active fins 105. The sacrificial gate structure 140' may include a sacrificial gate dielectric layer 142', a sacrificial gate electrode 145', and a gate electrode mask pattern layer 146'. The sacrificial gate dielectric layer 142' and the sacrificial gate electrode 145' may be patterned using the gate electrode mask pattern layer 146'. The sacrificial gate dielectric layer 142' may include a silicon oxide, and the sacrificial gate electrode 145' may include polysilicon. The gate electrode mask pattern layer 146' may include a silicon oxide and/or a silicon nitride. The sacrificial gate structure 140' may have a line shape, for example, may be formed to extend in the Y direction and to be spaced apart from each other in the X direction.

A gate spacer layer 144 (referring to FIG. 5A) may be formed on both sidewalls of the sacrificial gate structure 140'. The gate spacer layer 144 may be formed by forming a layer, having a uniform thickness, along an upper surface and a side surface of the sacrificial gate structure 140' and anisotropically etching the layer.

Source/drain regions 130 may be formed by removing a portion of the active fins 105 from both sides of the sacrificial gate structure 140' and performing a selective epitaxial growth (SEG) process on the removed active fins 105. Recesses may be formed by removing a portion of the active fins 105. The recesses may be formed by forming an additional mask layer or by etching a portion of the active fins 105 using the gate mask pattern layer 146' and the gate spacer layer 144 as masks. The recesses may be formed by sequentially applying, for example, a dry etching process and a wet etching process. The source/drain regions 130 may be formed on the etched active fins 105. The source/drain regions 130 may include impurities implanted by in-situ doping, and may also include a plurality of layers having different doping elements and/or doping concentrations.

After an etch-stop layer 135 is formed to cover the source/drain regions 130, a first interlayer insulating layer 181 may be formed.

The etch-stop layer 135 may cover the source/drain regions 130 and the isolation region 110 in the first region R1. The etch-stop layer 135 may cover side surfaces of the gate spacer layer 144. The etch-stop layer 135 may also be formed in the second region R2 and the third region R3, and may be substantially the same as the second protective layer 114. The second protective layer 114 may cover the first protective layer 112 on the second region R2 and the third region R3.

The first interlayer insulating layer 181 may be formed to cover the etch-stop layer 135 between the sacrificial gate structures 140' of the first region R1. The first interlayer insulating layer 181 may be formed to cover the second protective layer 114 of the second region R2. The first interlayer insulating layer 181 may be formed by forming an insulating layer to cover the sacrificial gate structures 140' and the source/drain regions 130 and performing a planarization process.

Figure 12A:
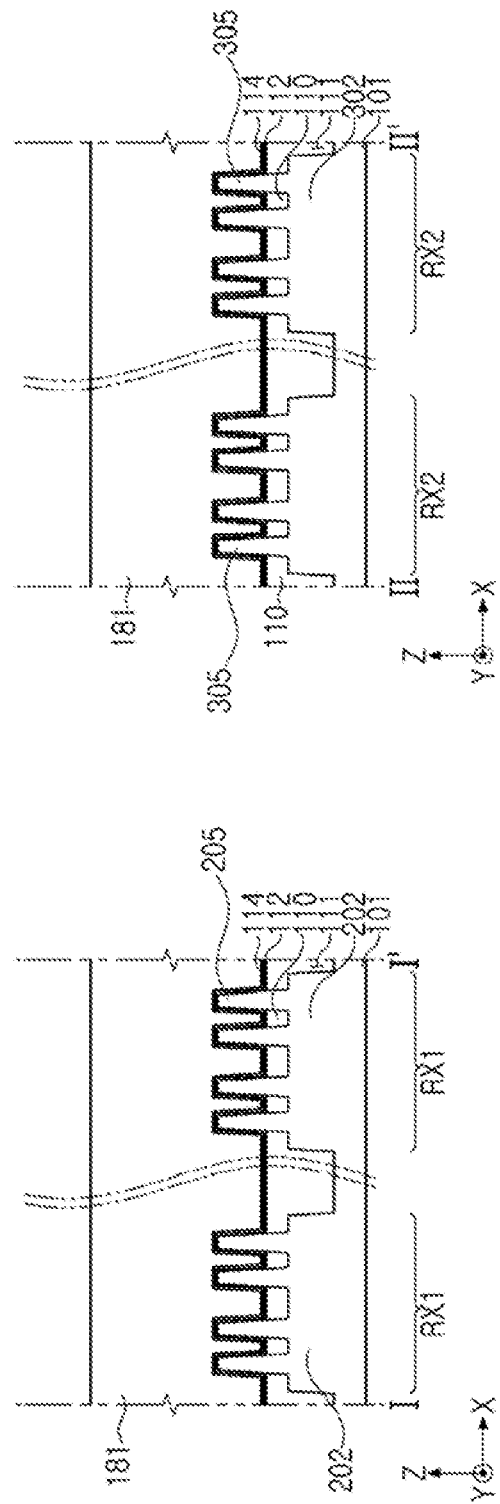
Figure 12B:
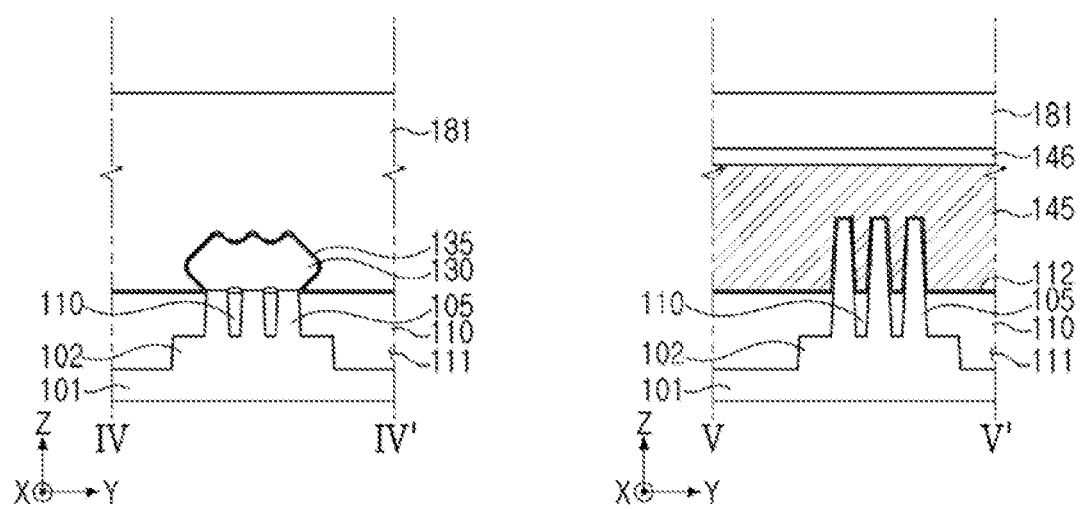

Referring to FIGS. 12A and 12B, a sacrificial gate structure 140' may be removed to form gap regions, and a gate dielectric layer 142, a gate electrode 145, and a gate capping layer 146 may be formed in the gap regions.

The sacrificial gate structure 140' may be selectively removed with respect to the gate spacer layer 144, the first interlayer insulating layer 181, and the active fins 105. The gap regions may be formed by removing the sacrificial gate structure 140'.

After the gate dielectric layer 142 and the gate electrode 145 are formed to fill the gap regions, they may be removed to a predetermined depth from upper portions of the gap regions. A gate capping layer 146 may be formed in a region in which the gate electrode 145 is removed from the gap regions. Accordingly, a gate structure 140 including the gate dielectric layer 142, the gate electrode 145, the gate spacer layer 144, and the gate capping layer 146 may be formed.

Figure 13A:
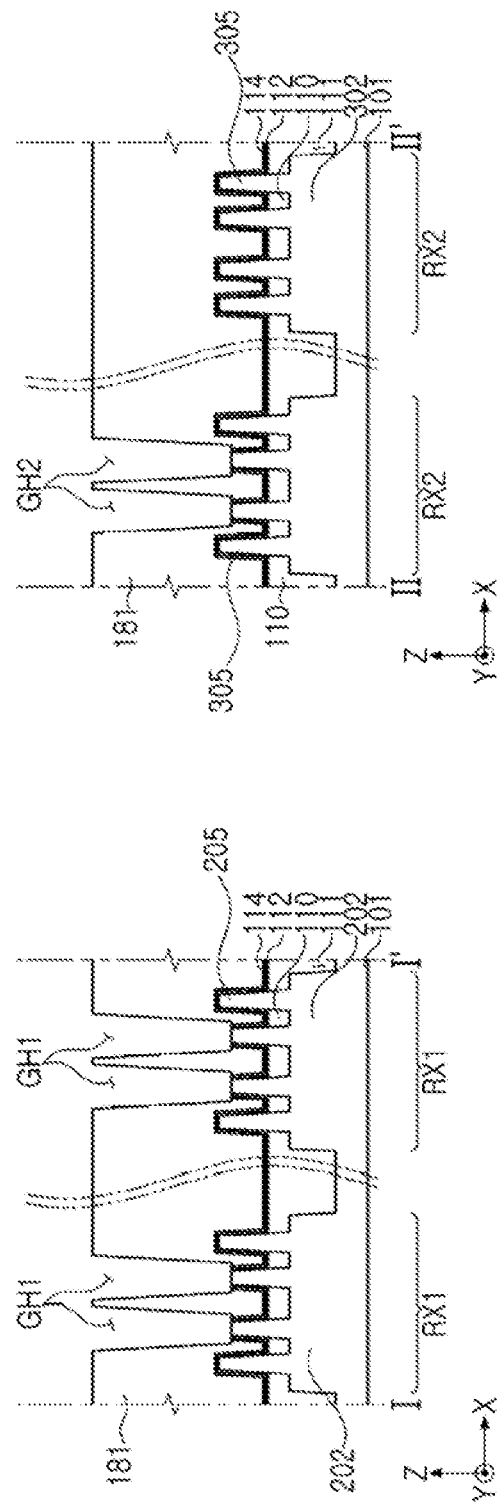
Figure 13B:
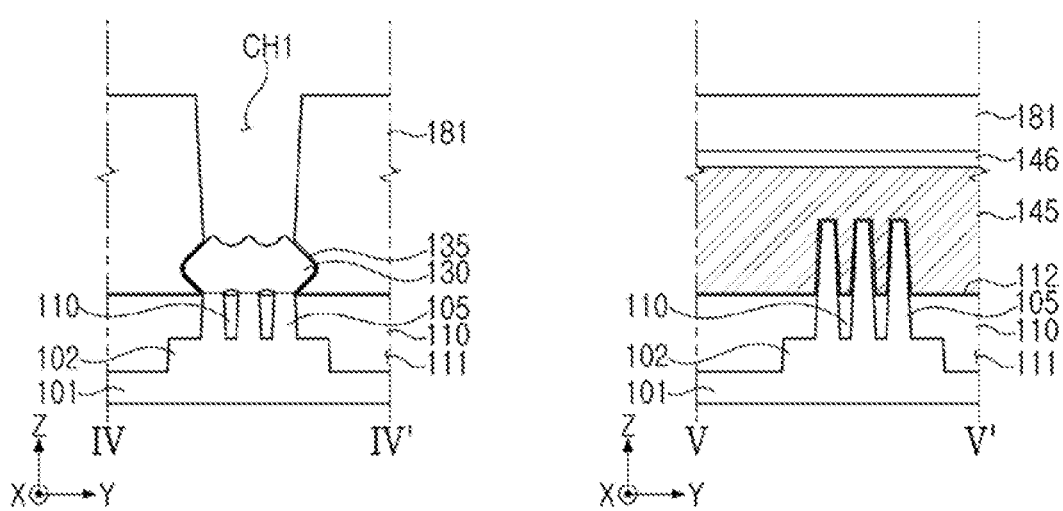

Referring to FIGS. 13A and 13B, the first interlayer insulating layer 181 may be patterned to form first guard contact holes GH1, second guard contact holes GH2, and contact holes CH1.

The contact holes CH1 may be formed by removing a portion of the first interlayer insulating layer 181 on both sides of the gate structure 140 using an additional mask layer such as a photoresist pattern. Lower surfaces of the contact holes CH1 may be recessed into the source/drain regions 130 or may have a curvature along upper surfaces of the source/drain regions 130. In an exemplary embodiment of the inventive concept, the shape and arrangement of the contact holes CH1 may be variously changed.

The first and second guard contact holes GH1 and GH2 may be formed by removing a portion of the first interlayer insulating layer 181 using an additional mask layer such as a photoresist pattern. The first and second guard contact holes GH1 and GH2 may recess portions of the first and second guard active fins 205 and 305 to expose the first and second guard active fins 205 and 305. The first and second guard contact holes GH1 and GH2 may also expose portions of the first and second protective layers 112 and 114. At least two first guard contact holes GH1 may be formed per first guard active structure RX1, and at least two second guard contact holes GH2 may be formed per second guard active structure RX2.

The first and second guard contact holes GH1 and GH2 may be formed to make a pair, and insulating residues, generated in a process of patterning the first interlayer insulating layer 181 to remove a portion thereof, may be prevented from being deposited in the first and second guard contact holes GH1 and GH2.

Figure 14A:
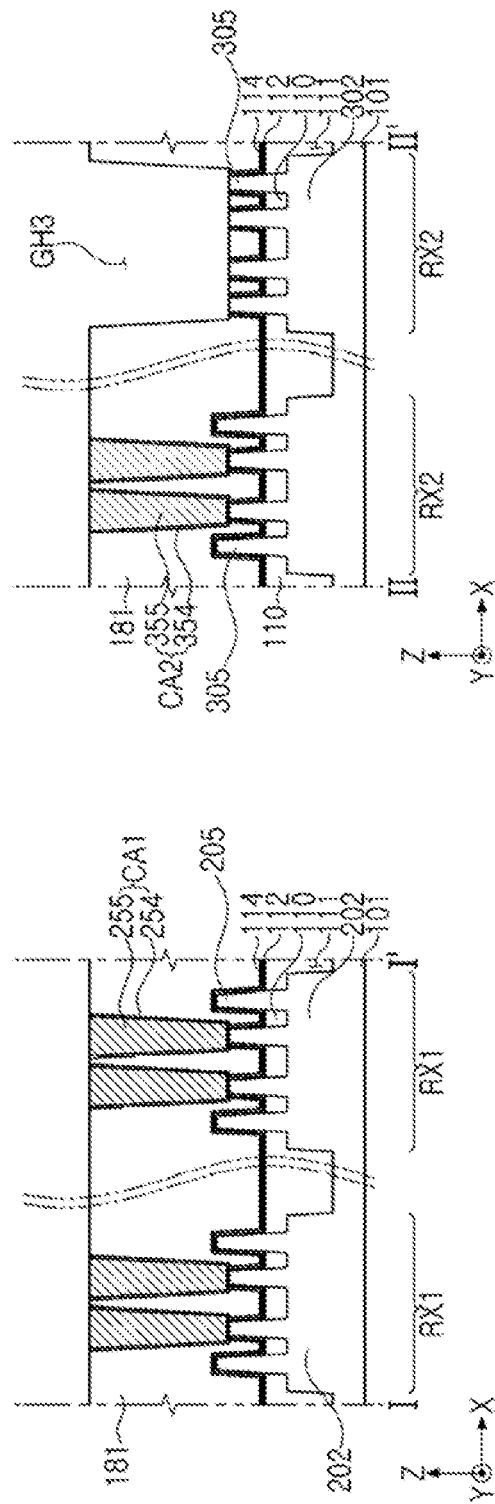
Figure 14B:
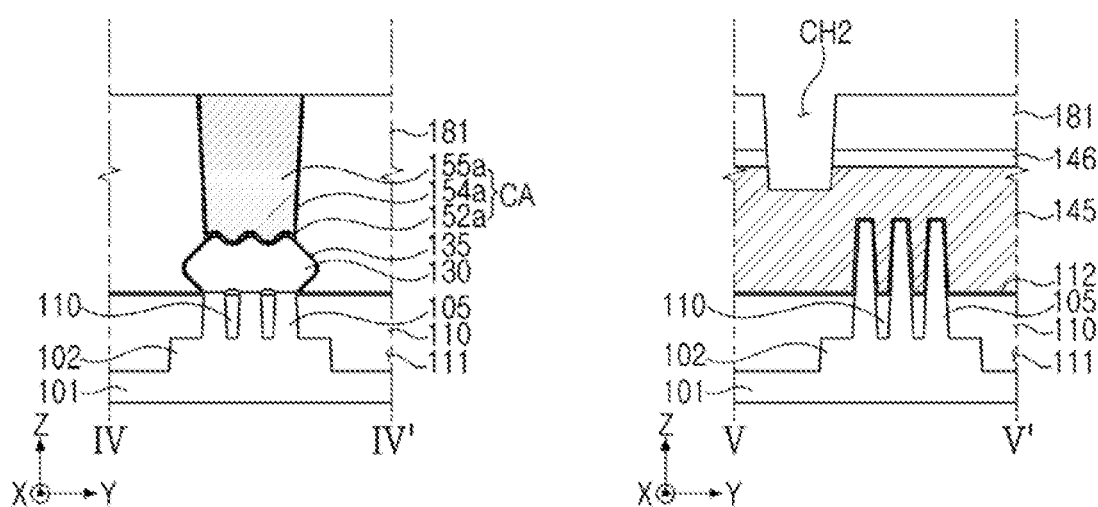

Referring to FIGS. 14A and 148, a circuit contact structure CA, a first guard contact structure CA1, and a second guard contact structure CA2 may be formed. The first interlayer insulating layer 181 may be patterned to form gate contact holes CH2 and third guard contact holes GH3.

The circuit contact structure CA may be formed in the contact holes CH1. A metal-semiconductor compound layer 152a may be formed on surfaces of the source/drain regions 130 exposed by the contact holes CH1. A barrier layer 154a and a contact plug 155a may be sequentially formed in the contact holes CH1.

The first and second guard contact structures CA1 and CA2 may be formed in the first and second guard contact holes GH1 and GH2, respectively. First and second guard barrier layers 254 and 354 and first and second guard contact plugs 255 and 355 may be sequentially formed in the first and second guard contact holes GH1 and GH2, respectively.

A planarization process may be performed during formation of the first and second guard contact structures CA1 and CA2 and the circuit contact structure CA.

The third guard contact holes GH3 may expose all of the second guard active fins 305 formed on the second guard active structure RX2. The third guard contact holes GH3 may be formed in a region in which the second guard contact structure CA2 is not formed on the second guard active structure RX2 in the third region R3. Accordingly, the second guard ring 300 may include at least one second guard contact structure CA2 and at least one third guard contact structure CA3. However, according to an exemplary embodiment, the second guard ring 300 may include only the second guard contact structure CA2 or only the third guard contact structure CA3.

Figure 15A:
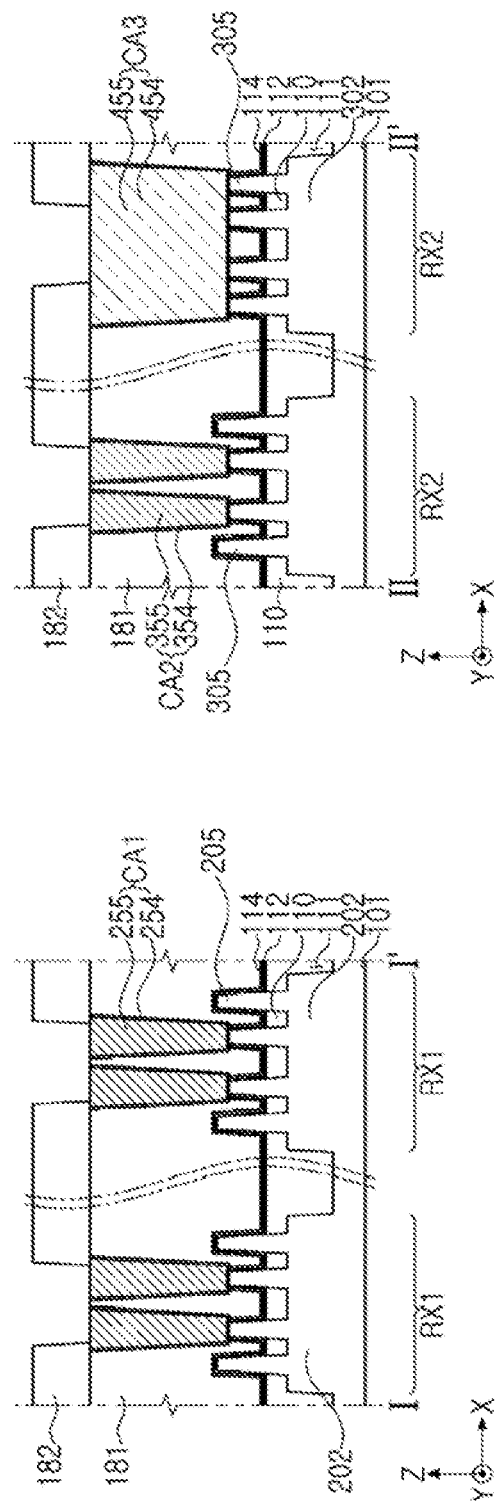
Figure 15B:
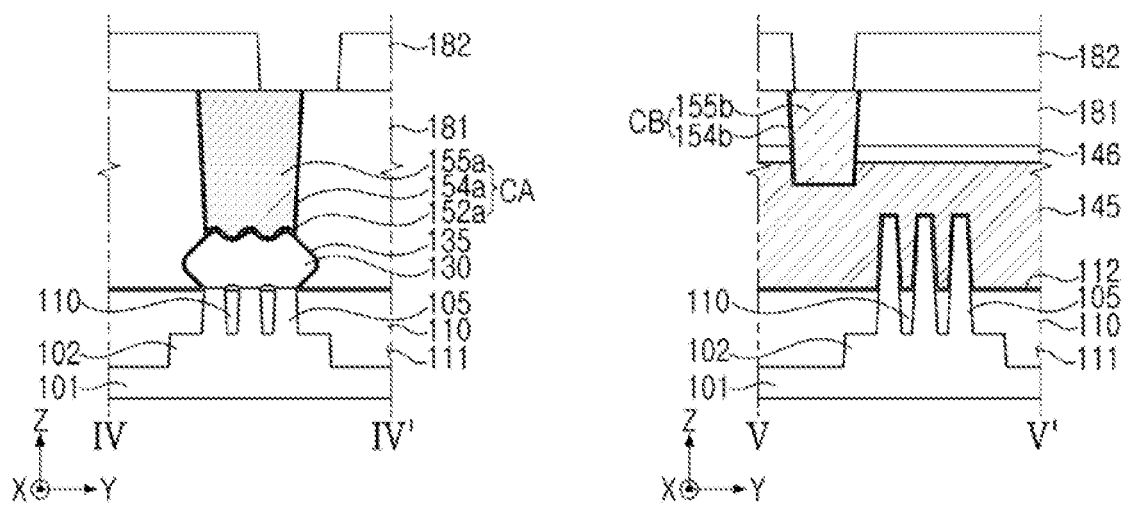

Referring to FIGS. 15A and 15B, the gate contact structure CB and the third guard contact structure CA3 may be formed in the gate contact holes CH2 and the third guard contact holes GH3, respectively. An interconnection trench may be formed by forming the second interlayer insulating layer 182 on the first interlayer insulating layer 181 and removing a portion of the second interlayer insulating layer 182.

Referring to FIGS. 3A to 5C, interconnection layers may be formed in the interconnection trench, a third interlayer insulating layer 183 and a plurality of vias 171, 172, 271, and 272 may be formed, and conductive lines 191, 192, 281, and 282 may be formed on the third interlayer insulating layer 183.

As described above, a semiconductor device includes a guard ring, in which a pair of contact structures are formed on a single active fin structure in a guard ring to protect operating characteristics of the semiconductor device and to increase the performance to prevent from external harmful environment, to reduce interface defects, caused by insulating residues, between an active fin structure and a contact structure during a high-selectivity etching process.

While the inventive concept has been particularly shown and described with reference to the exemplary embodiments thereof, it will be understood by one of ordinary skill in the art that variations in form and detail may be made therein without departing from the spirit and scope of the inventive concept.

What is claimed is:
1. A semiconductor device comprising:
a substrate;
a guard ring disposed on the substrate and adjacent to an edge of the substrate;
an integrated circuit structure surrounded by the guard ring and disposed on the substrate; and
an insulating material structure disposed on a side surface of the guard ring,
wherein the integrated circuit structure includes a circuit active fin disposed on the substrate, a gate structure intersecting the circuit active fin, a source or drain region on the circuit active fin adjacent to a side surface of the gate structure, a circuit contact structure disposed on the source or drain region, and a circuit interconnection structure disposed on the circuit contact structure,
wherein the guard ring includes a plurality of guard active structures on the substrate, a plurality of guard contact structures disposed on each of the plurality of guard active structures, and a guard interconnection structure disposed on a pair of guard contact structures adjacent to each other, among the plurality of guard contact structures,
wherein the source or drain region is disposed between the circuit contact structure and the circuit active fin,
wherein each of the plurality of guard active structures includes a plurality of guard active fins spaced apart from each other,
wherein in each of the plurality of guard active structures, upper surfaces of a first group of the plurality of guard active fins at least partially overlap the insulating material structure in a vertical direction, and upper surfaces of a second group of the plurality of guard active fins are in contact with the plurality of guard contact structures,
wherein the second group of the plurality of guard active fins are disposed in between the first group of the plurality of guard active fins,
wherein an upper surface of a guard active fin in the first group is disposed on a higher level than an upper surface of a guard active fin in the second group, and
wherein the vertical direction is perpendicular to an upper surface of the substrate.

2. The semiconductor device of claim 1, wherein the guard interconnection structure at least partially overlaps the pair of guard contact structures and the insulating material structure, wherein the insulating material structure is disposed between the pair of guard contact structures, in the vertical direction.

3. The semiconductor device of claim 1, wherein each of the plurality of guard contact structures has a width greater than a width of each of the plurality of guard active fins, and
wherein each of the plurality of guard contact structures is in contact with one of a pair of guard active fins adjacent to each other and is spaced apart from the other one of the pair of guard active fins.

4. A semiconductor device comprising:
a substrate;
an integrated circuit structure disposed on the substrate;
a guard ring disposed on the substrate at least partially surrounding the integrated circuit structure; and
an insulating material structure on a side surface of the guard ring,
wherein the integrated circuit structure includes a circuit active fin disposed on the substrate, a gate structure intersecting the circuit active fin, a source or drain region disposed on the circuit active fin adjacent to a side surface of the gate structure, a circuit contact structure disposed on the source or drain region, and a circuit interconnection structure disposed on the circuit contact structure, wherein the guard ring includes a guard active structure including a plurality of guard active fins spaced apart from each other and disposed on the substrate, a plurality of guard contact structures spaced apart from each other, and a guard interconnection structure disposed on the plurality of guard contact structures, wherein the plurality of guard contact structures are disposed on the guard active structure, wherein in the guard active structure, a second group of the plurality of guard active fins are disposed in between a first group of the plurality of guard active fins, wherein an upper surface of a guard active fin in the first group is disposed on a higher level than an upper surface of a guard active fin in the second group, wherein the source or drain region is disposed between the circuit contact structure and the circuit active fin, wherein the guard interconnection structure is in contact with the plurality of guard contact structures, wherein the guard active structure is in contact with the plurality of guard contact structures, and wherein the plurality of guard active fins include a pair of guard active fins adjacent to each other, and one of the pair of guard active fins is in contact with one of the plurality of guard contact structures and the other one of the pair of guard active fins is not in contact with the plurality of guard contact structures.

5. The semiconductor device of claim 4, wherein the insulating material structure comprises:

an isolation region disposed on side surfaces of the plurality of guard active fins;

a protective layer disposed on the isolation region; and an interlayer insulating layer disposed on the protective layer, wherein the protective layer covers an upper surface of a guard active fin of the plurality of guard active fins, which is not in contact with the plurality of guard contact structures, among the plurality of guard active fins.

6. The semiconductor device of claim 4, wherein the second group of the plurality of guard active fins overlap the plurality of guard contact structures, and wherein the first group of the plurality of guard active fins are excluded from overlapping the plurality of guard contact structures.

7. A semiconductor device comprising:

a substrate;

an integrated circuit structure disposed on the substrate;

a guard ring disposed on the substrate at least partially surrounding the integrated circuit structure; and an insulating material structure on a side surface of the guard ring, wherein the integrated circuit structure includes a circuit active fin disposed on the substrate, a gate structure intersecting the circuit active fin, a source or drain region disposed on the circuit active fin adjacent to a side surface of the gate structure, a circuit contact structure disposed on the source or drain region, and a circuit interconnection structure disposed on the circuit contact structure, wherein the guard ring includes a guard active structure including a plurality of guard active fins spaced apart from each other and disposed on the substrate, a plurality of guard contact structures spaced apart from each other, and a guard interconnection structure disposed on the plurality of guard contact structures, wherein the source or drain region is disposed between the circuit contact structure and the circuit active fin, wherein the guard interconnection structure is in contact with the plurality of guard contact structures, wherein the guard active structure is in contact with the plurality of guard contact structures, wherein the plurality of guard active fins include a pair of guard active fins adjacent to each other, and one of the pair of guard active fins is in contact with one of the plurality of guard contact structures and the other one of the pair of guard active fins is not in contact with the plurality of guard contact structures, wherein both side surfaces of the guard interconnection structure, opposing each other, at least partially overlap upper surfaces of the plurality of guard contact structures that are adjacent to each other, in a vertical direction, wherein an area between the both side surfaces of the guard interconnection structure at least partially overlaps the insulating material structure in the vertical direction, and wherein the vertical direction is perpendicular to an upper surface of the substrate.

* * * * *